(12) United States Patent
Lee et al.

(10) Patent No.: US 12,300,733 B2
(45) Date of Patent: May 13, 2025

(54) SEMICONDUCTOR DEVICE WITH A WORK FUNCTION LAYER HAVING AN OXYGEN-BLOCKING DOPANT LAYER

(71) Applicant: Taiwan Semiconductor Manufacturing Co., Ltd., Hsinchu (TW)

(72) Inventors: Chia-Ching Lee, New Taipei (TW); Hung-Chin Chung, Pingzhen (TW); Chung-Chiang Wu, Taichung (TW); Hsuan-Yu Tung, Keelung (TW); Kuan-Chang Chiu, Hsinchu (TW); Chien-Hao Chen, Chuangwei Township (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 207 days.

(21) Appl. No.: 17/854,749

(22) Filed: Jun. 30, 2022

(65) Prior Publication Data
US 2022/0336619 A1 Oct. 20, 2022

Related U.S. Application Data

(63) Continuation of application No. 16/889,217, filed on Jun. 1, 2020, now Pat. No. 11,387,344.

(Continued)

(51) Int. Cl.
*H01L 29/49* (2006.01)
*H01L 21/28* (2006.01)
(Continued)

(52) U.S. Cl.
CPC .... *H01L 29/4966* (2013.01); *H01L 21/28097* (2013.01); *H01L 21/82345* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856;
(Continued)

(56) References Cited

U.S. PATENT DOCUMENTS 9,299,704 B2  3/2016  Ji et al.
9,362,385 B2  6/2016  Cheng et al.
(Continued)

FOREIGN PATENT DOCUMENTS

CN  105321811 A  2/2016
CN  106328529 A  1/2017
(Continued)

*Primary Examiner* — Younes Boulghassoul
(74) *Attorney, Agent, or Firm* — Slater Matsil, LLP

(57) ABSTRACT

A semiconductor device and method of manufacture are provided. In some embodiments a treatment process is utilized to treat a work function layer. The treatment prevents excessive oxidation of the work function layer during subsequent processing steps, such as application of a subsequent photoresist material, thereby allowing the work function layer to be thinner than otherwise.

20 Claims, 30 Drawing Sheets

Related U.S. Application Data

(60) Provisional application No. 62/982,465, filed on Feb. 27, 2020.

(51) Int. Cl.
  *H01L 21/8234* (2006.01)
  *H01L 21/8238* (2006.01)
  *H01L 29/40* (2006.01)
  *H01L 29/66* (2006.01)
  *H01L 29/78* (2006.01)

(52) U.S. Cl.
  CPC .............. *H01L 21/823828* (2013.01); *H01L 21/823842* (2013.01); *H01L 29/401* (2013.01); *H01L 29/4975* (2013.01); *H01L 29/66545* (2013.01); *H01L 29/66795* (2013.01); *H01L 29/785* (2013.01); *H01L 29/7851* (2013.01)

(58) Field of Classification Search
  CPC ... H01L 2029/7857–7858; H01L 2924/13067; H01L 21/28079; H01L 21/28088; H01L 21/28097; H01L 21/28105; H01L 29/495–4958; H01L 29/4966; H01L 29/4975; H01L 29/4983; H01L 21/823437; H01L 21/82345; H01L 21/823828; H01L 21/823842
  See application file for complete search history.

(56) References Cited

U.S. PATENT DOCUMENTS

| | | | |
|---|---|---|---|
| 9,431,496 | B2 | 8/2016 | Kang |
| 10,535,523 | B1 | 1/2020 | Lin et al. |
| 2007/0128858 | A1 | 6/2007 | Haukka et al. |
| 2009/0194818 | A1 | 8/2009 | Ramaswamy et al. |
| 2013/0295759 | A1 | 11/2013 | Lu et al. |
| 2015/0171177 | A1* | 6/2015 | Cheng ............... H01L 29/66545 257/288 |
| 2016/0049491 | A1 | 2/2016 | Lin et al. |
| 2018/0040620 | A1 | 2/2018 | Ha et al. |
| 2018/0174922 | A1 | 6/2018 | Chiu et al. |
| 2018/0261678 | A1 | 9/2018 | Lee et al. |
| 2019/0035916 | A1 | 1/2019 | Chiu et al. |
| 2019/0067011 | A1* | 2/2019 | Wang ................... H01L 21/3215 |
| 2019/0096681 | A1 | 3/2019 | Wei et al. |
| 2019/0148510 | A1* | 5/2019 | Chien ............... H01L 29/66795 257/192 |
| 2019/0326281 | A1 | 10/2019 | Chen et al. |
| 2019/0371675 | A1* | 12/2019 | Tsai ............... H01L 21/823431 |
| 2019/0385855 | A1* | 12/2019 | Chien ............... H01L 29/66795 |

FOREIGN PATENT DOCUMENTS

| | | |
|---|---|---|
| JP | H08288507 A | 11/1996 |
| KR | 20080029297 A | 4/2008 |
| KR | 20150071637 A | 6/2015 |
| KR | 20180015484 A | 2/2018 |
| KR | 20190013403 A | 2/2019 |
| TW | 201545352 A | 12/2015 |

* cited by examiner

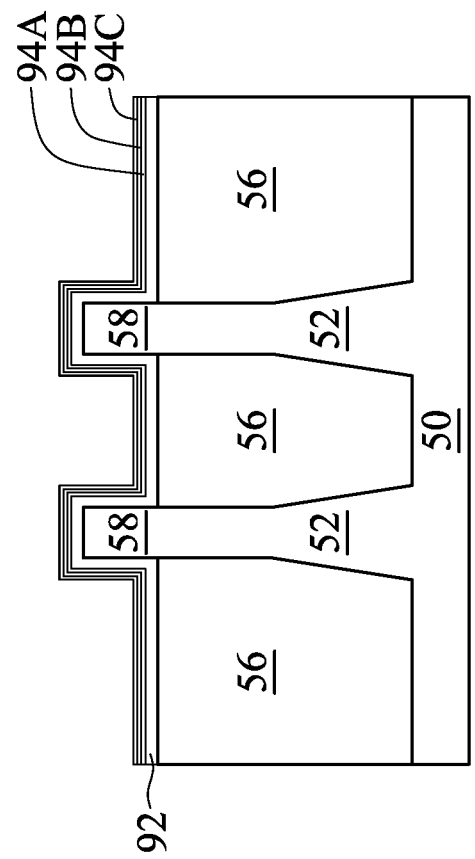
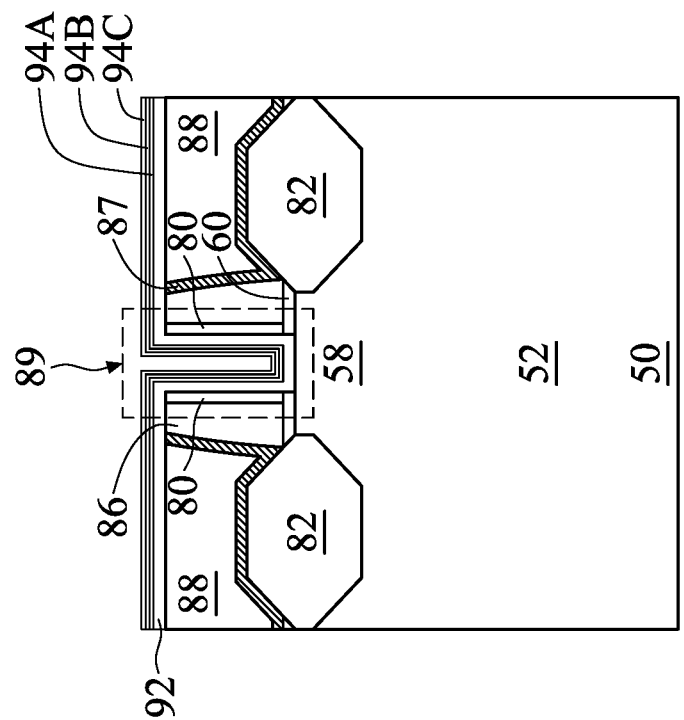
Figure 14A
Figure 14B

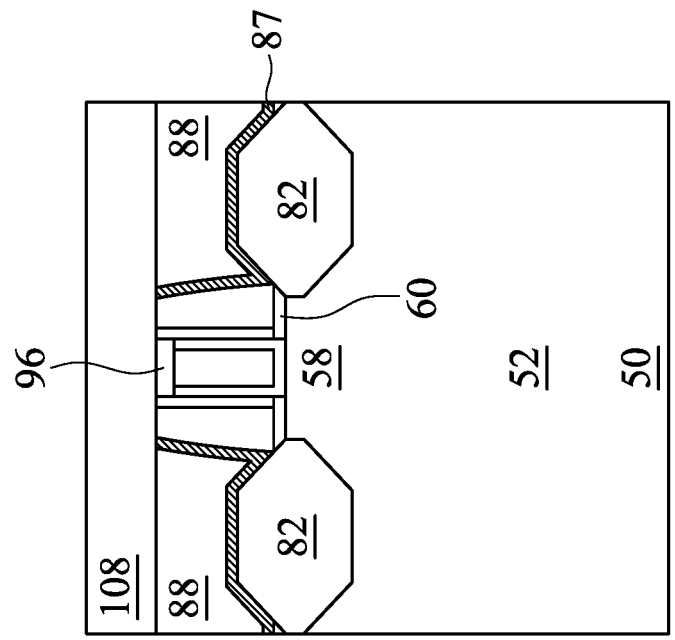
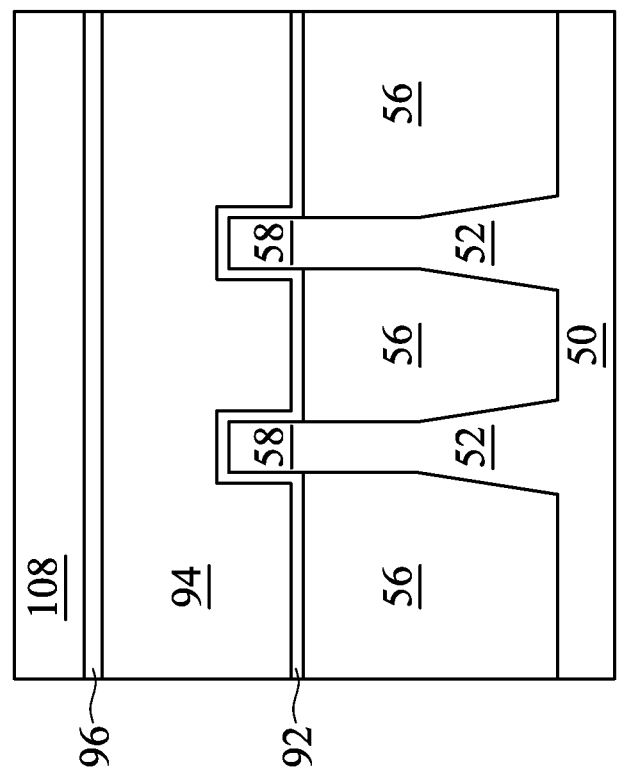
Figure 20A
Figure 20B

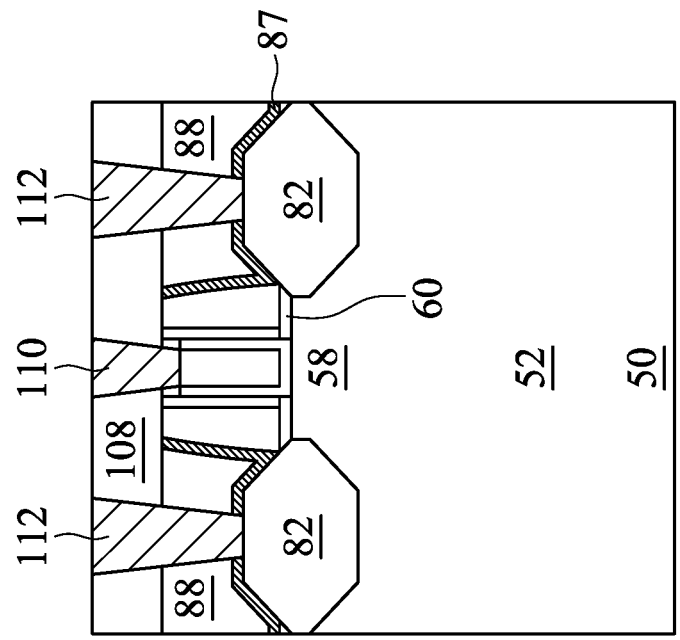
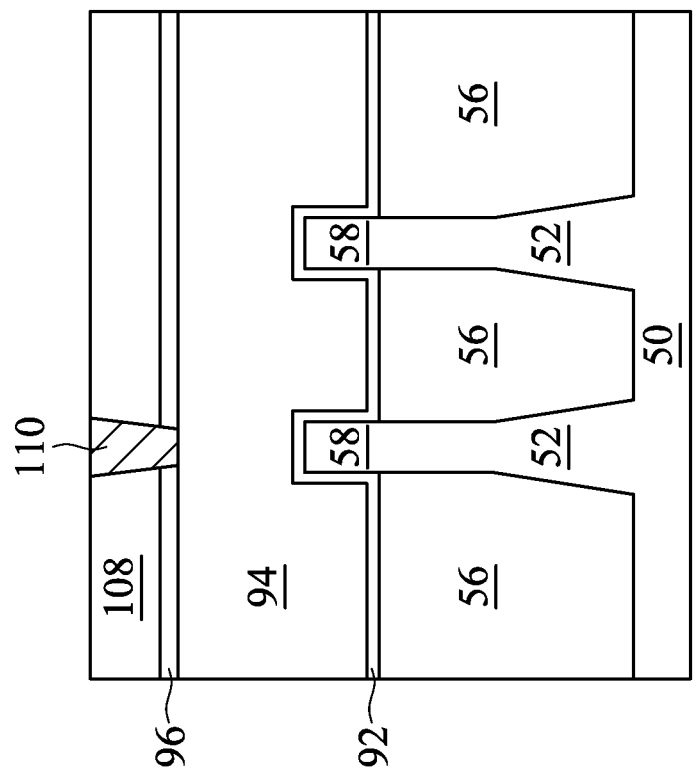
Figure 21A                    Figure 21B

SEMICONDUCTOR DEVICE WITH A WORK FUNCTION LAYER HAVING AN OXYGEN-BLOCKING DOPANT LAYER

PRIORITY CLAIM AND CROSS-REFERENCE

This application is a continuation of U.S. patent application Ser. No. 16/889,217, filed on Jun. 1, 2020, entitled "Semiconductor Devices and Methods of Manufacture," which claims the benefit of U.S. Provisional Application No. 62/982,465, filed on Feb. 27, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17, 18, 19A, 19B, 20A, 20B, 21A, and 21B are cross-sectional views of intermediate stages in the manufacturing of FinFETs, in accordance with some embodiments.

DETAILED DESCRIPTION

Figure 1:
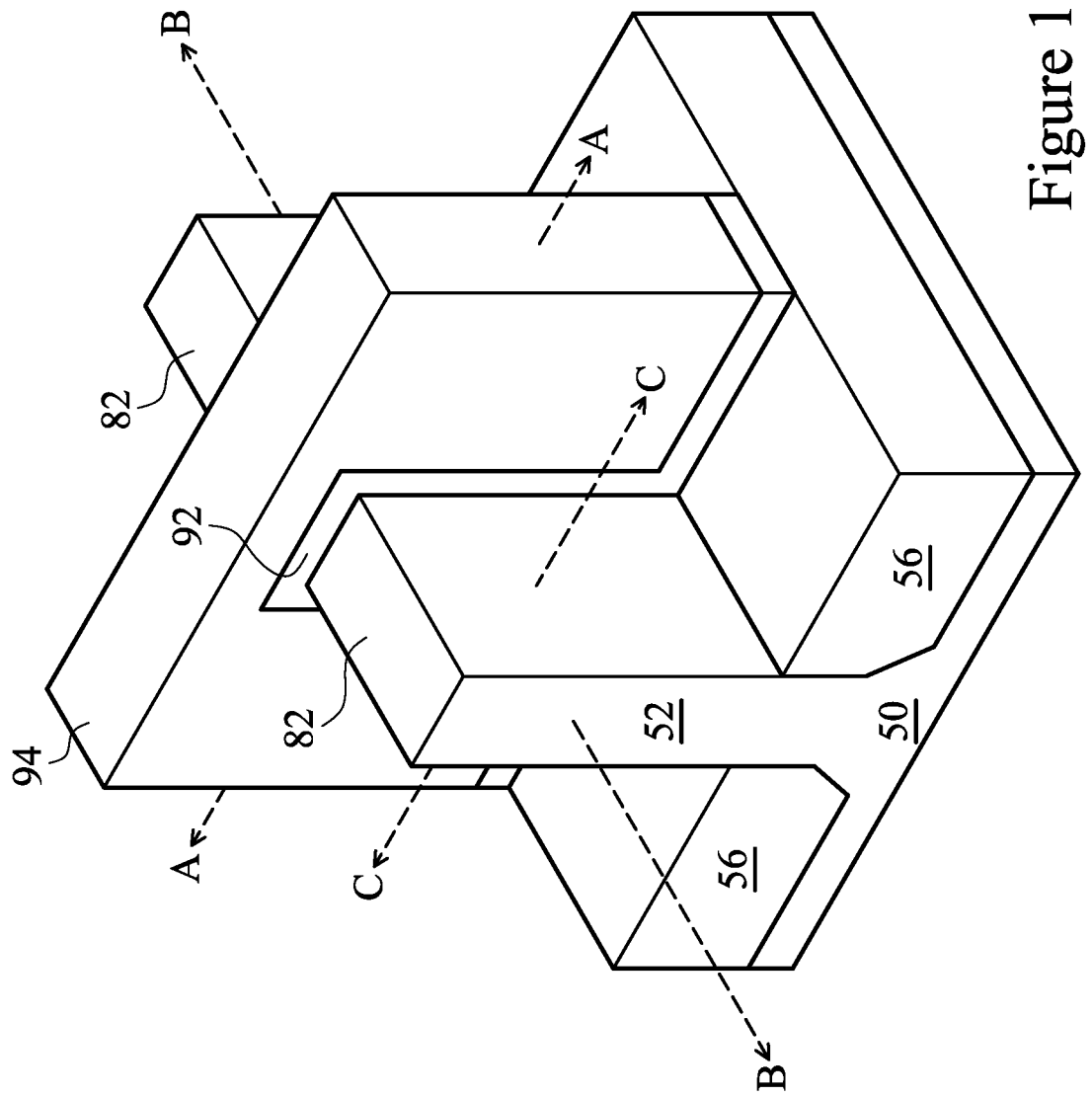
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which form a fin field effect transistor (finFET). However, the embodiments described herein may be applied in a wide variety of devices and methods, such as nano structures, and all such embodiments are fully intended to be included within the scope of the embodiments.

With respect now to FIG. 1, FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 21B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, and 14A are illustrated along reference cross-section A-A illustrated in FIG. 1, and FIGS. 8B, 9B, 10B, 11B, 12B, 13B, 14B, 14C, 15A, 16A, 17, and 18 are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
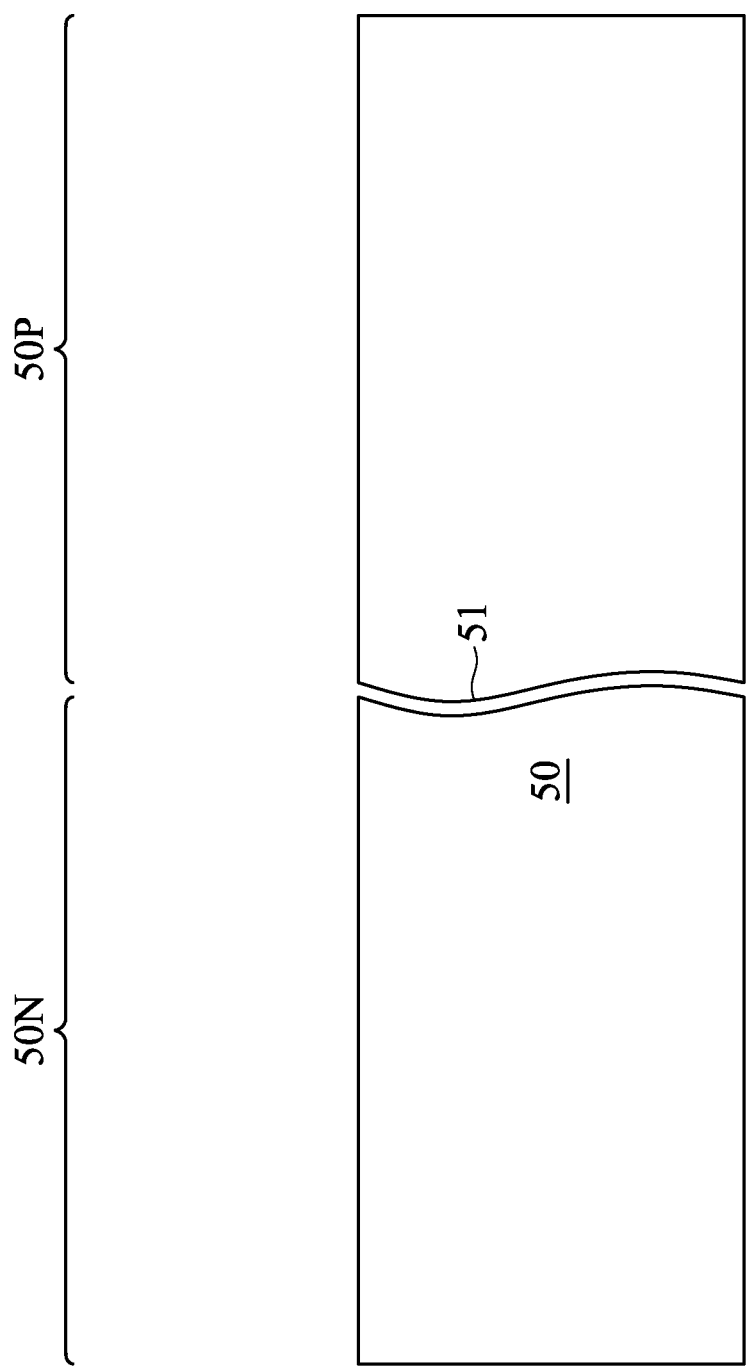

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
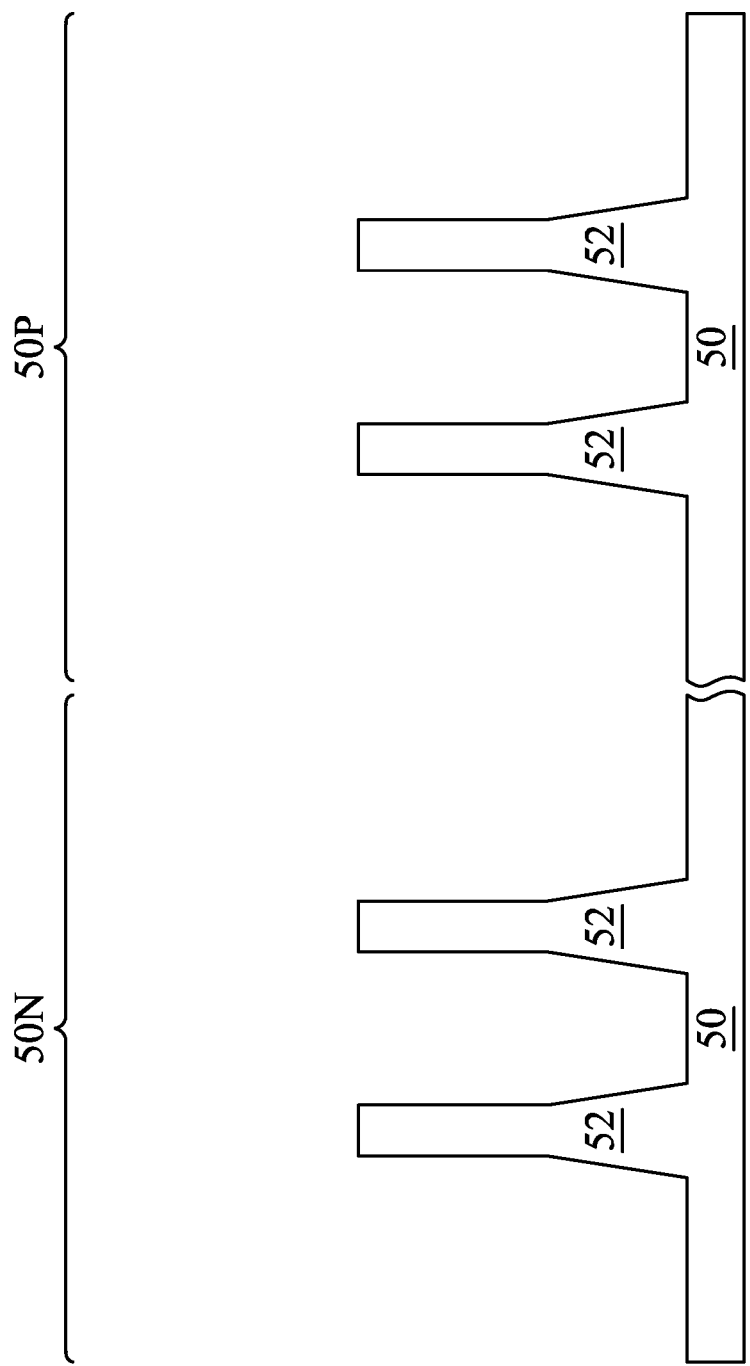

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
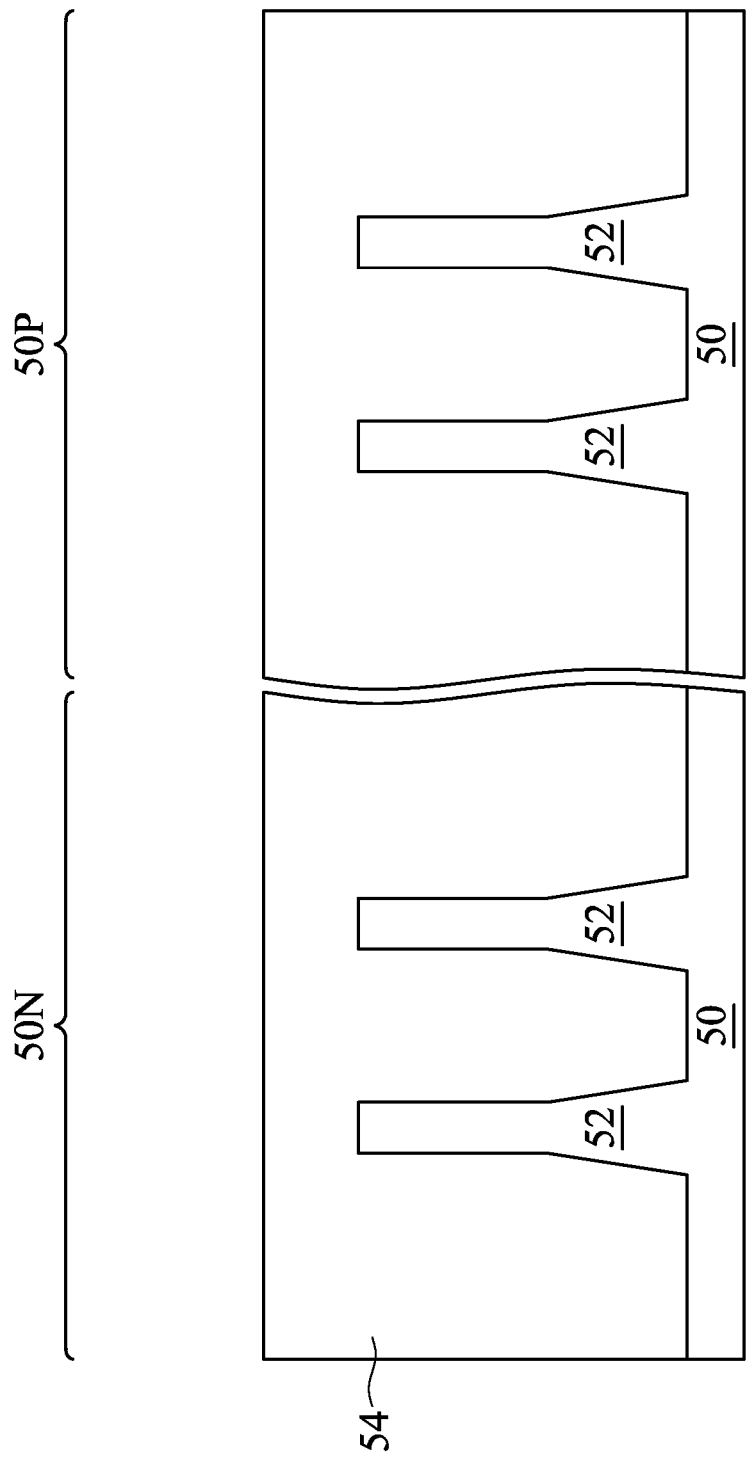

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
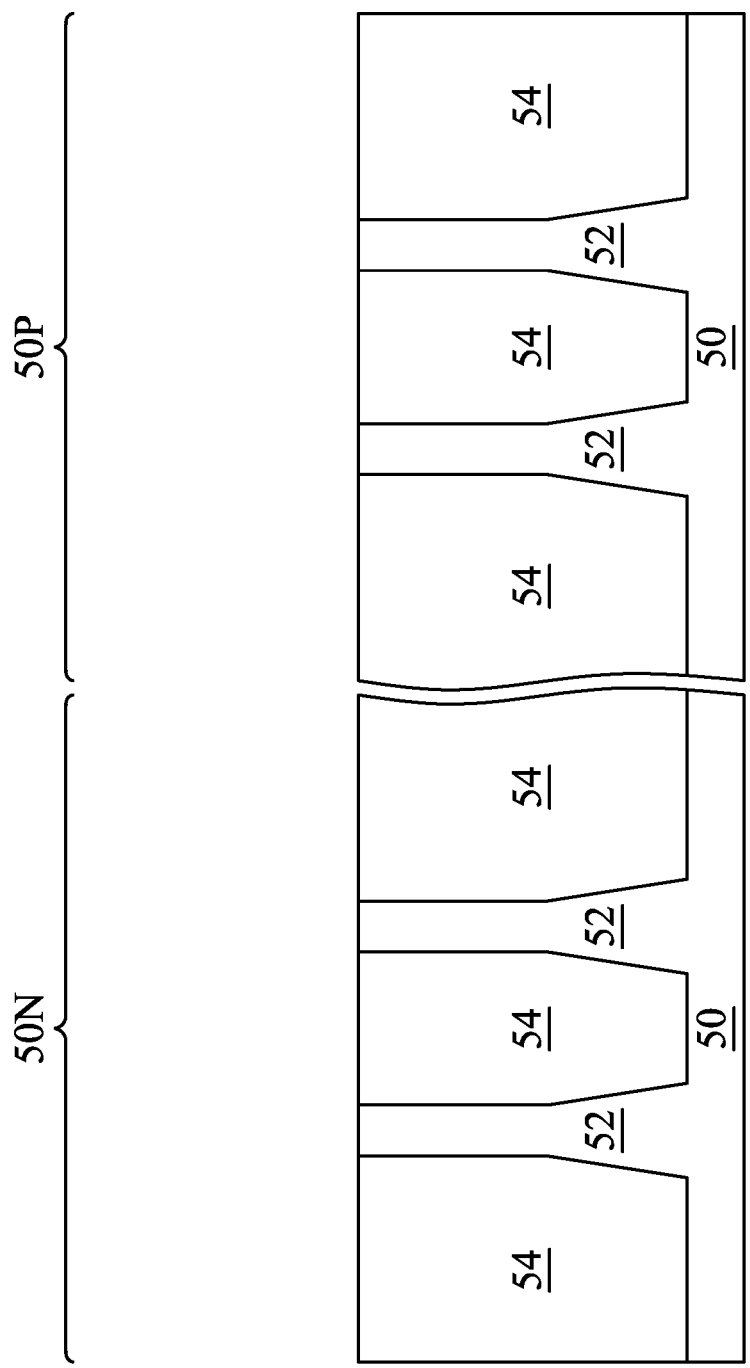

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
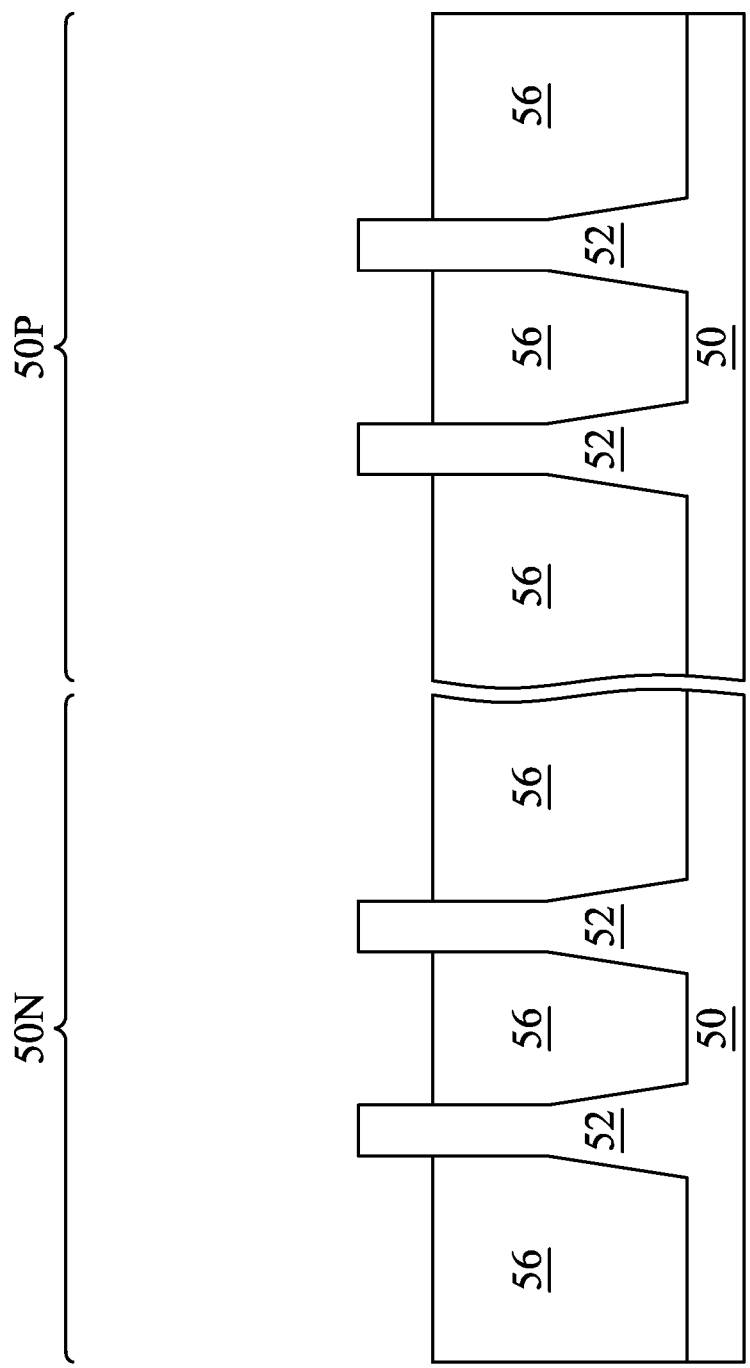

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
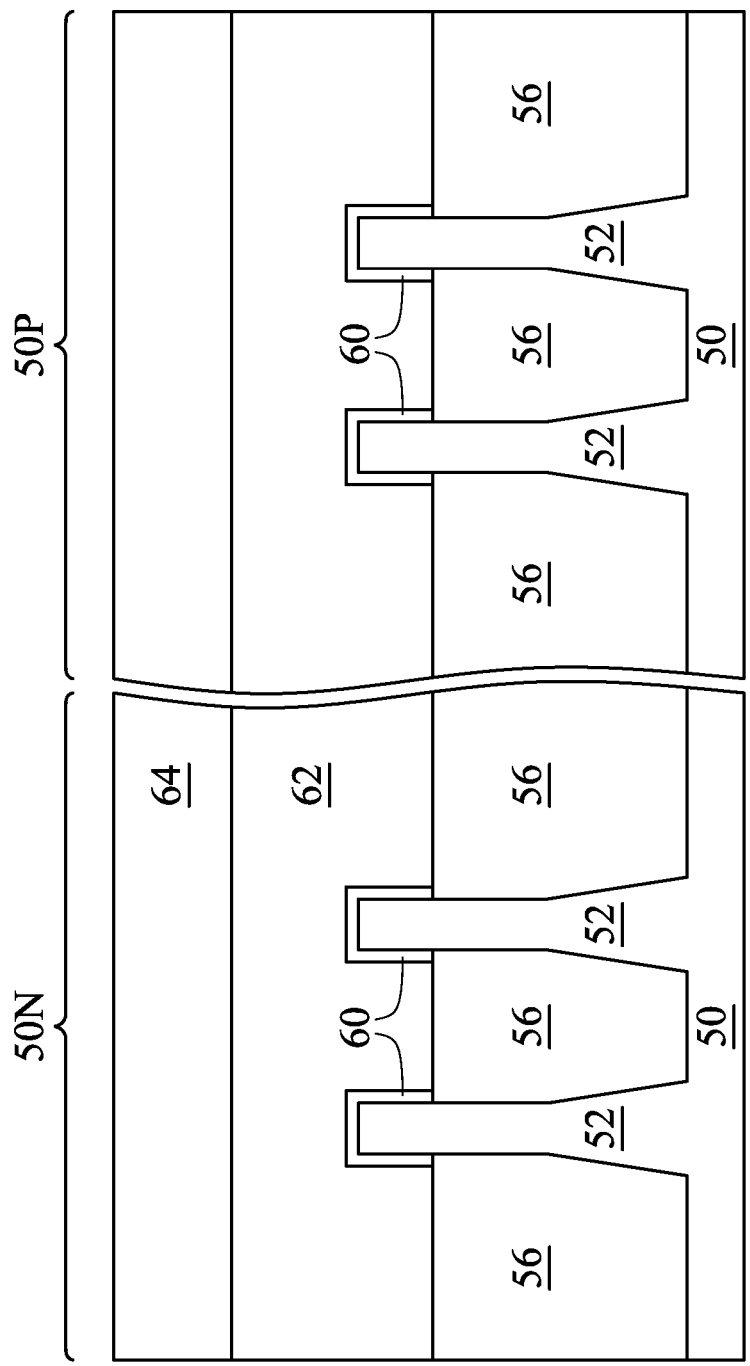

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8B:
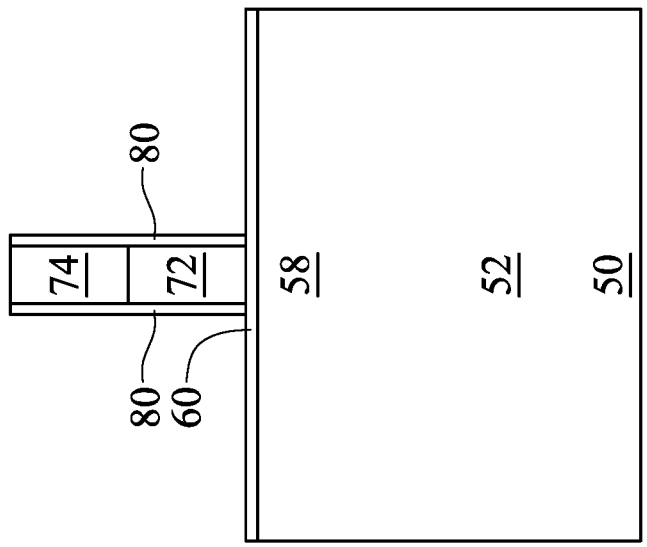
Figure 8A:
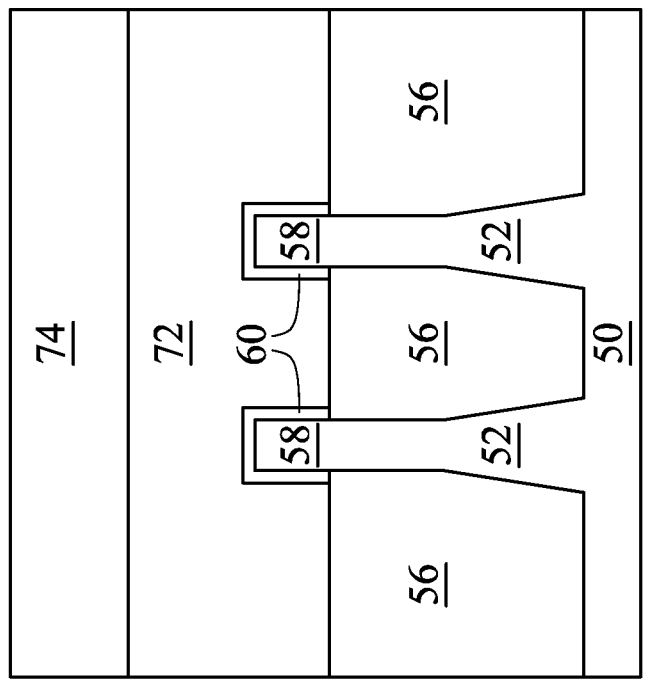

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
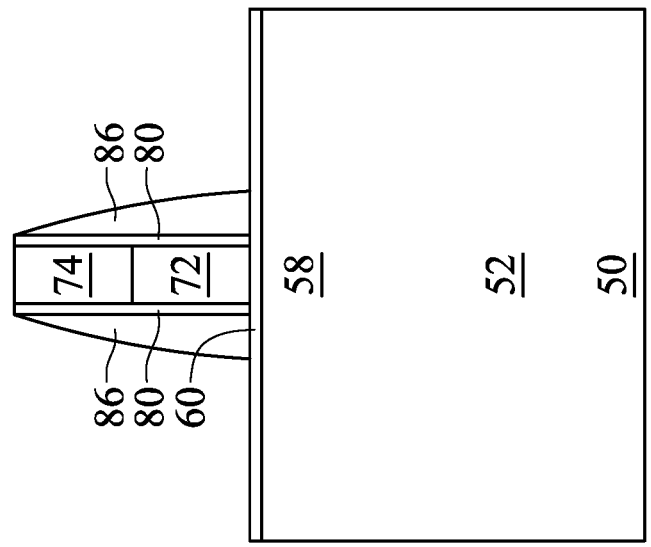
Figure 9A:
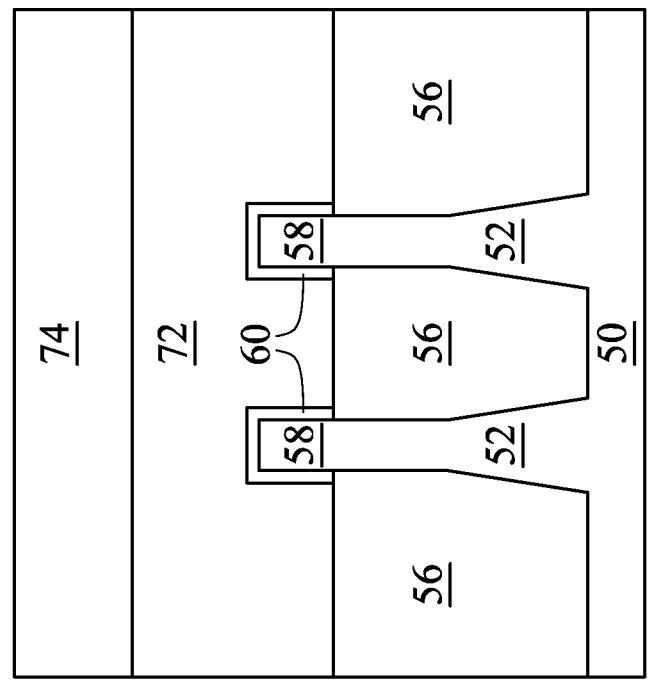

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
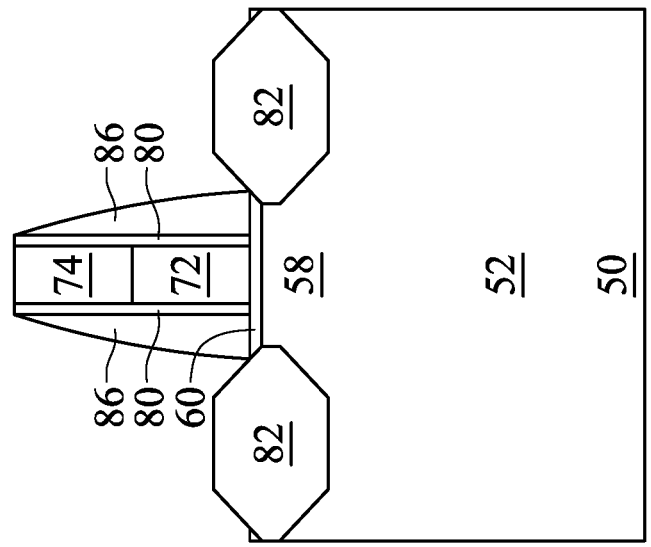
Figure 10A:
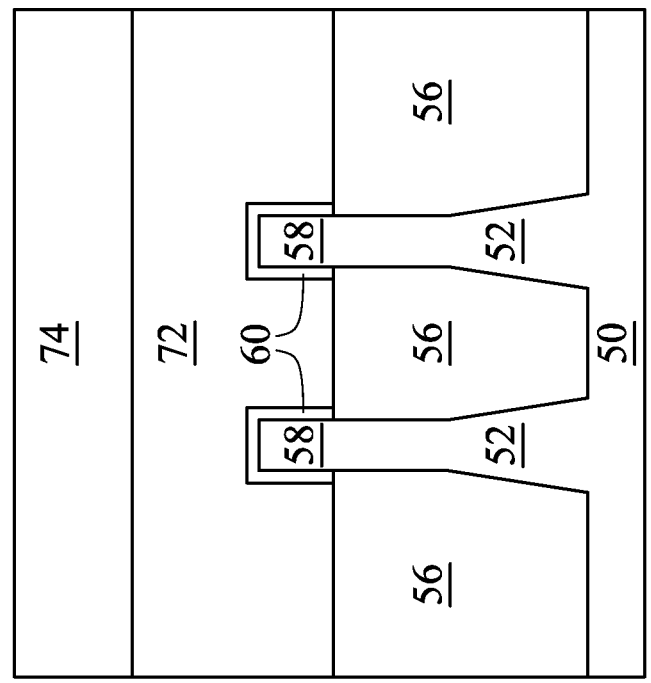
Figure 10C:
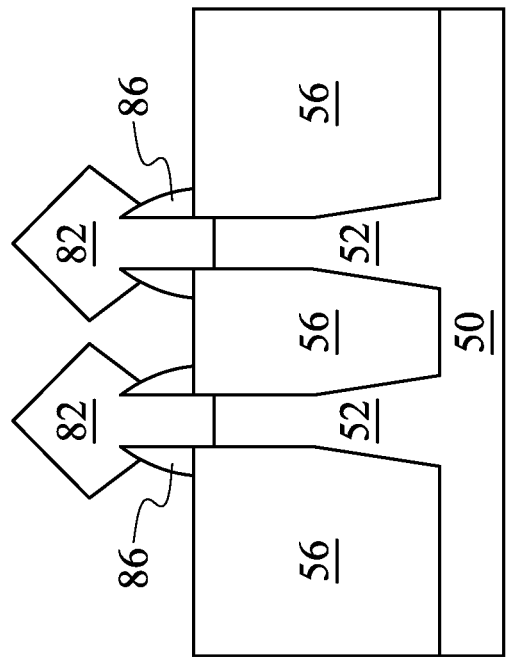
Figure 10D:
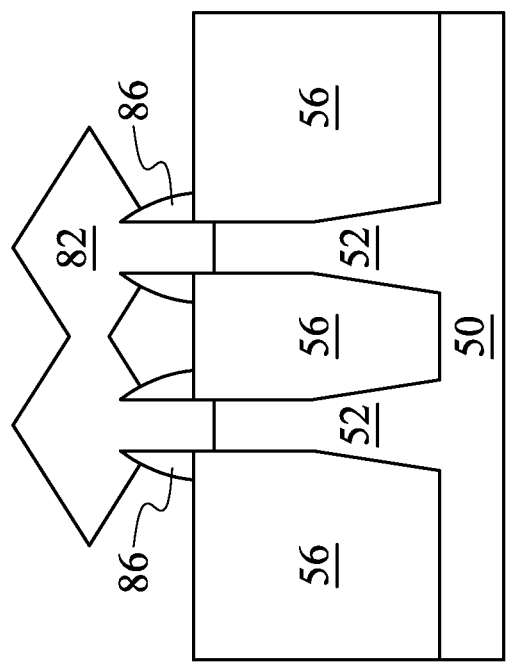

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
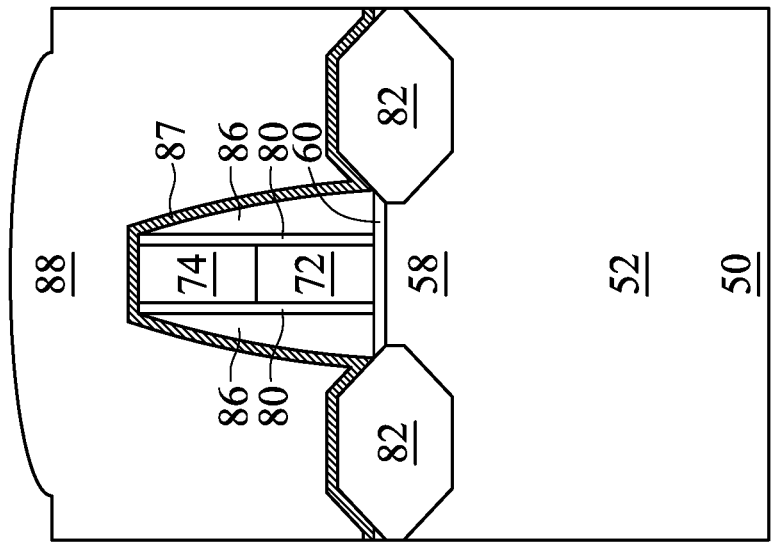
Figure 11A:
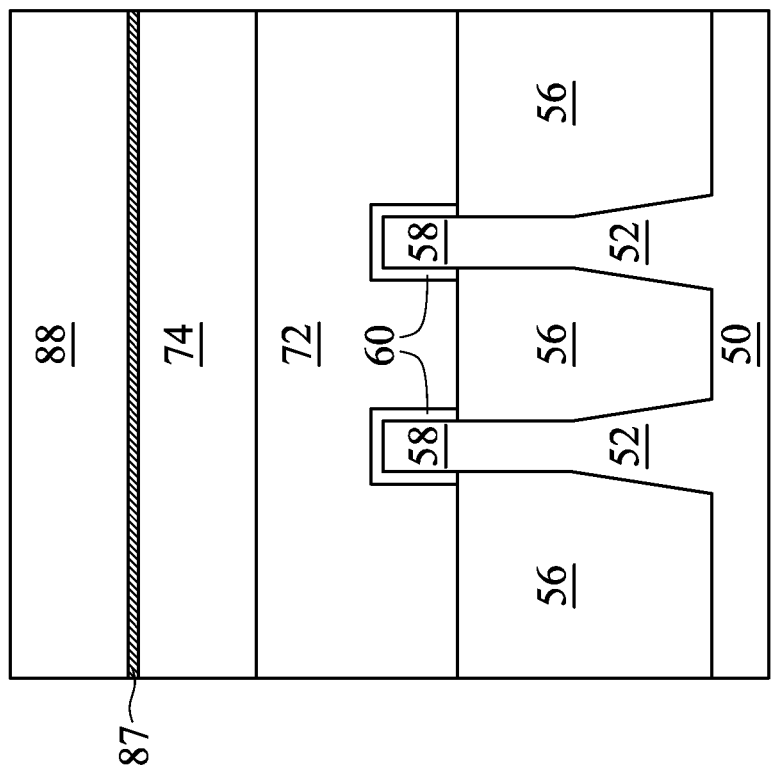

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
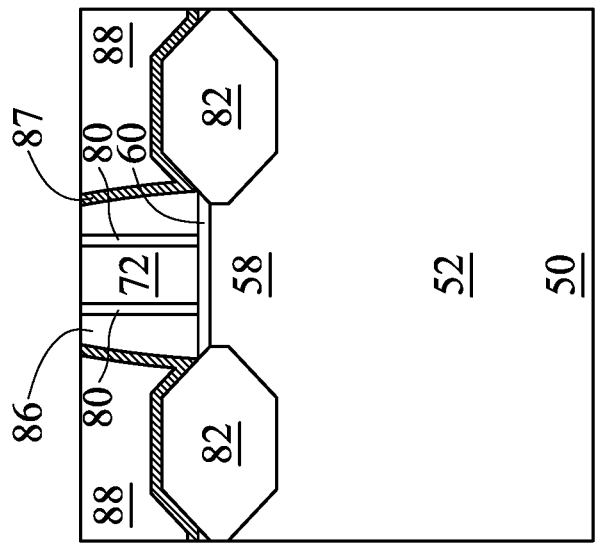
Figure 12A:
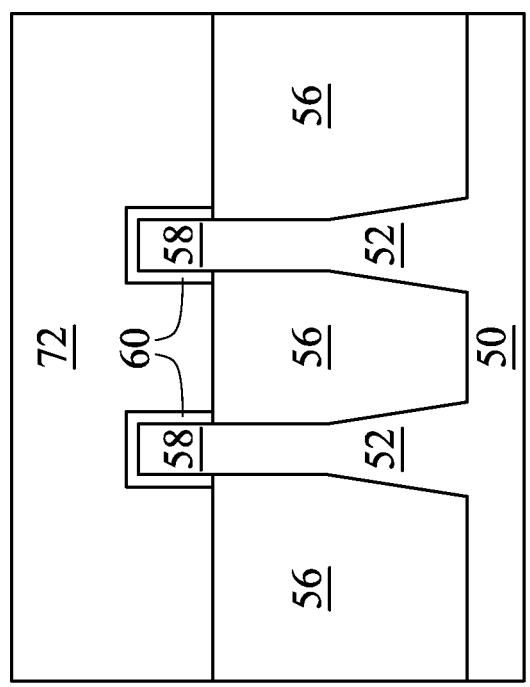

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
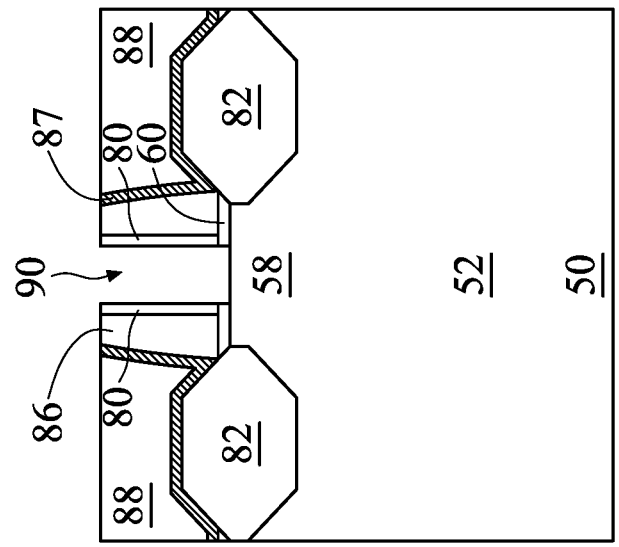
Figure 13A:
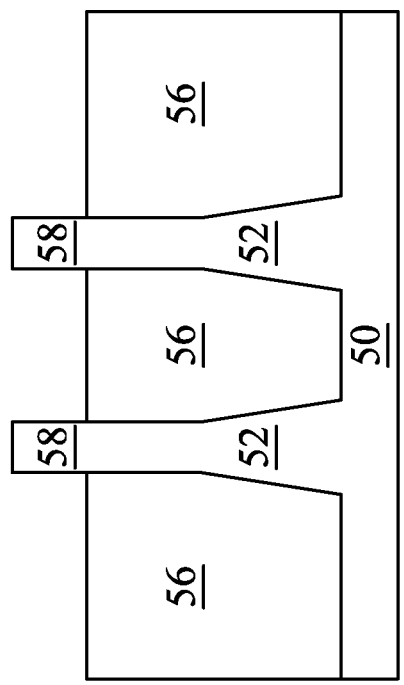

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14C:
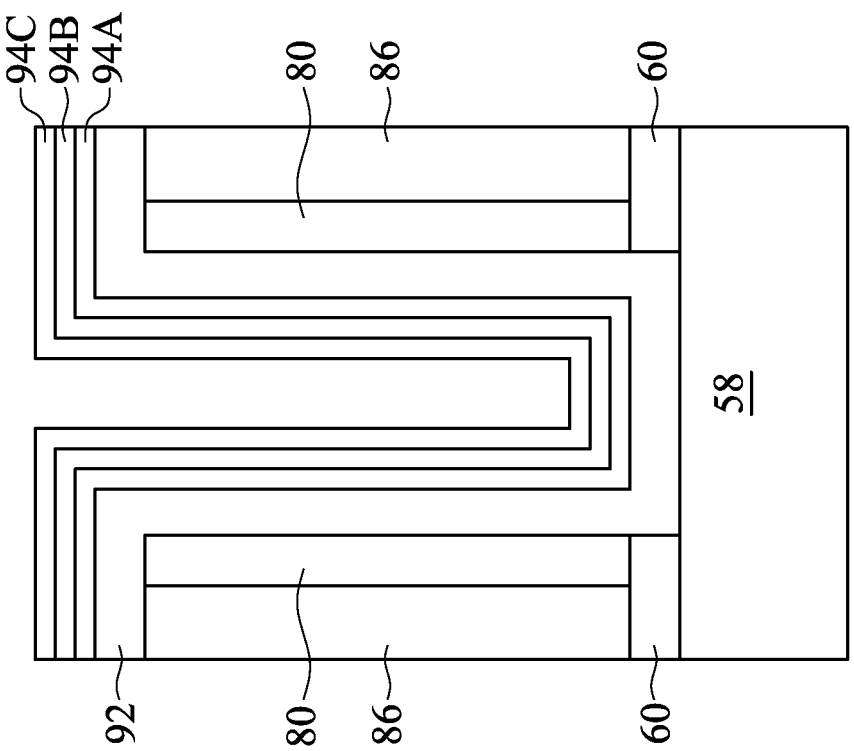

In FIGS. 14A, 14B, and 14C, gate dielectric layers 92 are formed for replacement gates, with FIG. 14C illustrating a detailed view of region 89 of FIG. 14B. Gate dielectric layers 92 comprise one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

Once the gate dielectric layers 92 have been formed, a capping layer 94A may be formed over the gate dielectric layers 92. The capping layer 94A may be a metal silicide material such as titanium silicon nitride (TSN). In an embodiment the capping layer 94A may be formed using a deposition process such as chemical vapor deposition, although any suitable method of deposition, such as a deposition and subsequent silicidation, may be utilized to a thickness of between about 5 Å and about 30 Å. However, any suitable thickness may be utilized.

Once the capping layer 94A has been formed, a first barrier layer 94B may be formed adjacent to the capping layer 94A. For example, the first barrier layer 94B may be formed from a metallic material such as TiN, Ti, TiAlN, TaC, TaCN, TaSiN, Mn, Zr, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first barrier layer 94B may be deposited using a deposition process such as atomic layer deposition, chemical vapor deposition, sputtering, or the like, to a thickness of between about 5 Å and about 200 Å, although any suitable deposition process or thickness may be used.

After the capping layer 94B has been formed, a first work function tuning layer 94C may be formed. In some embodiments the first work function tuning layer 94C may be a p-type work function metal which may be nitride based (e.g., titanium nitride (TiN), titanium silicon nitride ($TiSi_xN_y$), tungsten nitride ($WN_x$), tungsten carbonitride ($WC_xN_y$), molybdenum nitride ($MoN_x$), combinations of these, or the like), or else may be one or more metal layers such as tungsten, molybdenum, gold, platinum, combinations of these, or the like. In other embodiments the first work function tuning layer 94C may be an n-type work function material which may be aluminum based (e.g., titanium aluminum nitride ($TiAl_xN_y$), tantalum aluminum nitride ($TaAl_xN_y$)), or a silicide such as titanium silicide ($TiSi_x$), tantalum silicide (TaSi), combinations of these, or the like. However, any suitable material may be utilized.

In an embodiment the first work function tuning layer 94C is deposited using a deposition process such as atomic layer deposition (ALD), chemical vapor deposition (CVD), sputtering, combinations of these, or the like. Additionally, the first work function tuning layer 94C may be deposited to a thickness of between about 5 Å and about 30 Å, such as 10 Å. However, any suitable processes and thicknesses may be utilized.

Figure 15A:
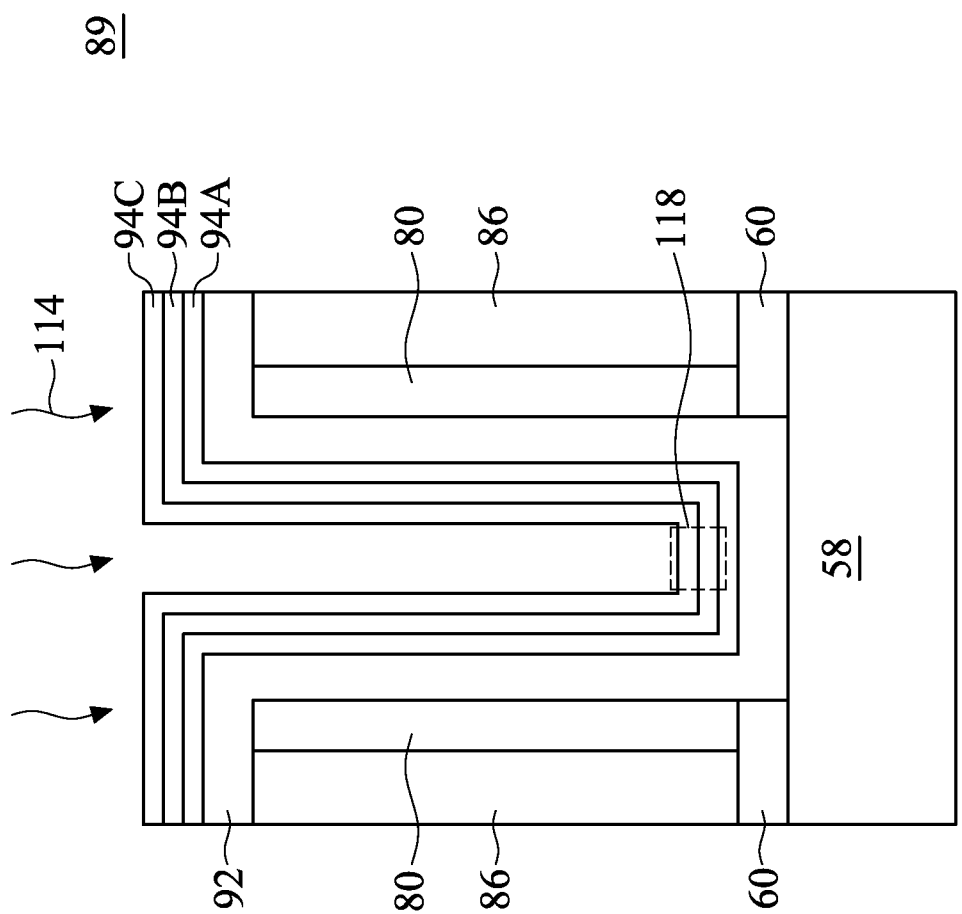
Figure 15B:
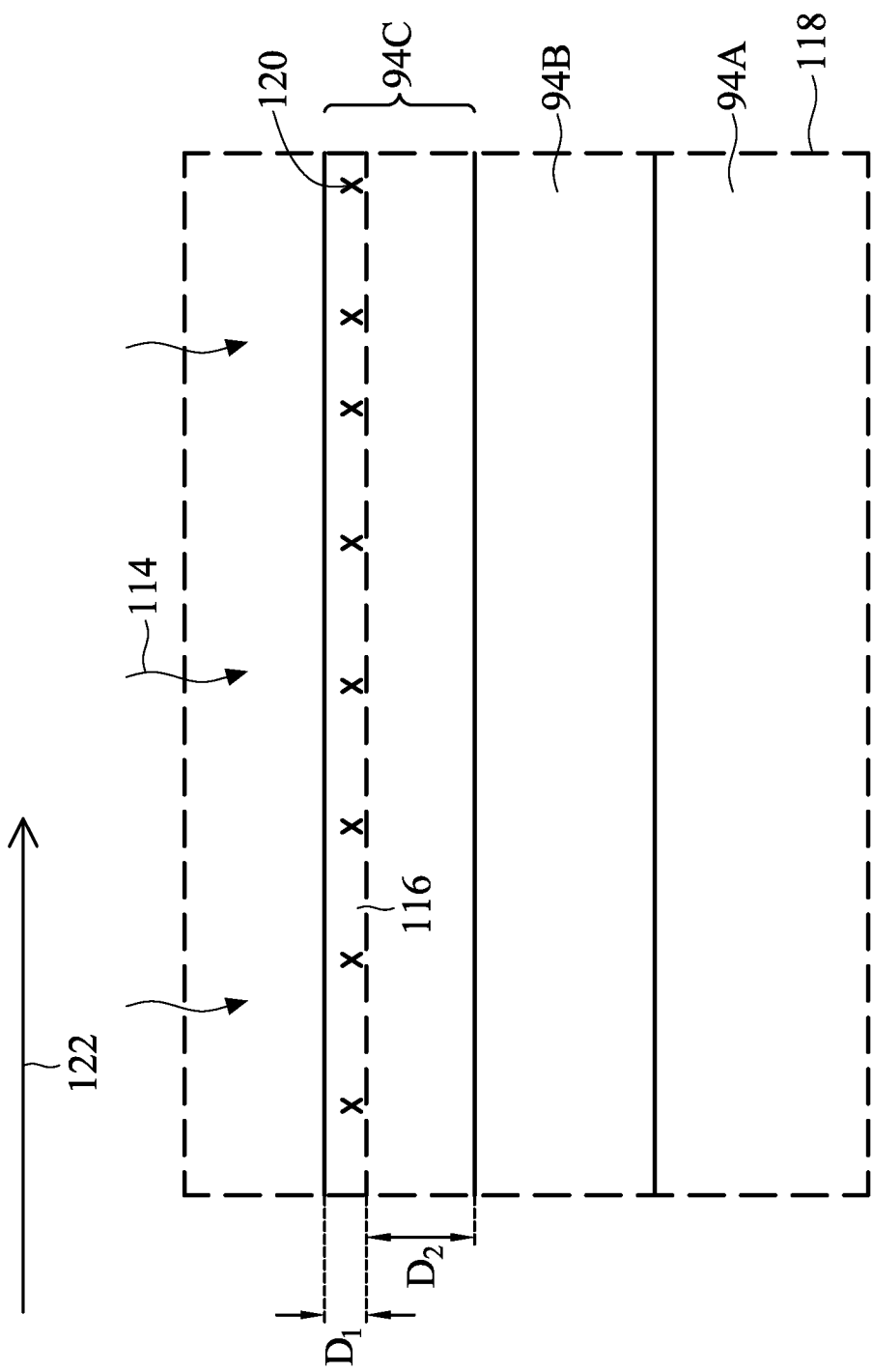

FIGS. 15A-15B illustrate a treatment process (represented in FIGS. 15A-15B by the curved arrows labeled 114) that is utilized to create an anti-reaction layer 116 within the first work function tuning layer 94C, with FIG. 15B illustrating a close-up view of the dashed box labeled 118 in FIG. 15A. In an embodiment the treatment process 114 may be used to react with a portion of the first work function tuning layer 94C and prevent subsequent oxidation of the first work function tuning layer 94C in subsequent processes.

In an embodiment the treatment process 114 may be a chemical soaking process which can be performed either in-situ along with the deposition of the first work function tuning layer 94C or else performed ex-situ. In such an embodiment a precursor (represented in FIG. 15B by the arrows labeled 122) is flowed over the first work function tuning layer 94C, and is utilized to introduce an active element dopant (represented in FIG. 15B by the "X"s labeled 120) into the first work function tuning layer 94C. In some embodiments the active element dopants 120 are chosen in order to be able to block subsequent infiltration of oxygen or other undesired elements from intruding past the anti-reaction layer 116. In embodiments in which it is desired to prevent the movement of oxygen, the active element dopants 120 may be an element such as tungsten, titanium, aluminum, tantalum, silicon, nitrogen, boron, chromium, combinations of these, or the like. However, any suitable dopants may be utilized.

In an embodiment in which the treatment process 114 is a chemical soaking process, the active element dopants 120 may be introduced by passing the precursor 122 over the surface of the first work function tuning layer 94C. In an embodiment the precursor 122 is a chemical which comprises the desired active element dopant 120 and also allows for the controlled placement of the active element dopants 120. As such, while the precise precursor is dependent at least in part on the desired active element dopant 120, in some embodiments the precursors may be a chemical such as tungsten chloride ($WCl_x$), titanium chloride ($TiCl_4$), tetraethylaluminium (TEA), trimethylaluminium (TMA), aluminum chloride ($AlCl_x$), tetrakis(dimethylamido)titanium (TDMAT), tantalum chloride ($TaCl_x$), silane ($SiH_4$), disilane ($Si_2H_6$), ammonia, elemental nitrogen, diborane ($B_2H_6$), combinations of these, or the like. However, any suitable precursor materials may be utilized.

To initiate the treatment process 114 the precursor 122 is introduced to a treatment chamber over the first work function tuning layer 94C. In an embodiment the precursor 122 may be introduced at a flow rate of between about 10 sccm and about 500 sccm, such as about 50 sccm. Additionally, the treatment process 114 may be performed at a pressure of between about 0.5 torr and about 25 torr, such as about 5 torr and at a temperature of between about 200° C. and about 470° C., such as about 400° C. However, any suitable process parameters may be utilized.

During the treatment process 114 the precursor 122 will come into contact with the top surface of the first work function tuning layer 94C, where the precursor 122 will react with the material of the first work function tuning layer 94C. This reaction will cause the active element dopant 120 to remain within the material of the first work function tuning layer 94C while undesired by-products from the reaction remain in gaseous form and are removed from the surface of the first work function tuning layer 94C.

Additionally, in some embodiments either the precursor 122 or the reacted active element dopant 120 will diffuse into the first work function tuning layer 94C from the surface. If the precursor 122 diffuses, the precursor 122 will react with the material of the first work function tuning layer 94C and byproducts will diffuse back out of the first work function tuning layer 94C. Either way, a diffusion gradient of the active element dopants 120 is formed within the first work function tuning layer 94C.

Accordingly, the treatment process 114 will form the anti-reaction layer 116 from the material of the first work function tuning layer 94C and the active element dopants 120. In an embodiment the treatment process 114 may be continued for a time sufficient to have an active element dopant 120 concentration along a top surface of the anti-reaction layer 116 of between about 1% and about 40%, such as about 5%. For example, the treatment process 114 may be continued for a time of between about 1 second and about 180 seconds, such as greater than about 20 seconds. However, any suitable time may be utilized.

Additionally, because of the diffusion of the active element dopants 120, the anti-reaction layer 116 may extend into the material of the first work function tuning layer 94C with a concentration gradient that reduces the concentration of the active element dopants 120 as the distance from the surface increases. In some embodiments the anti-reaction layer 116 extends to a first depth $D_1$ of between about 1 Å and about 10 Å, such as about 5 Å, leaving a portion of the first work function tuning layer 94C having a second depth $D_2$ that has no oxygen active element dopants 120, wherein the second depth $D_2$ may be between about 0 Å and about 10 Å, such as about 2 Å. However, any suitable depths may be utilized.

For example, in an embodiment in which the first work function tuning layer 94C comprises titanium nitride and the active element dopant 120 is aluminum, the first work function tuning layer 94C will comprise aluminum from the treatment process 114.

Figure 16A:
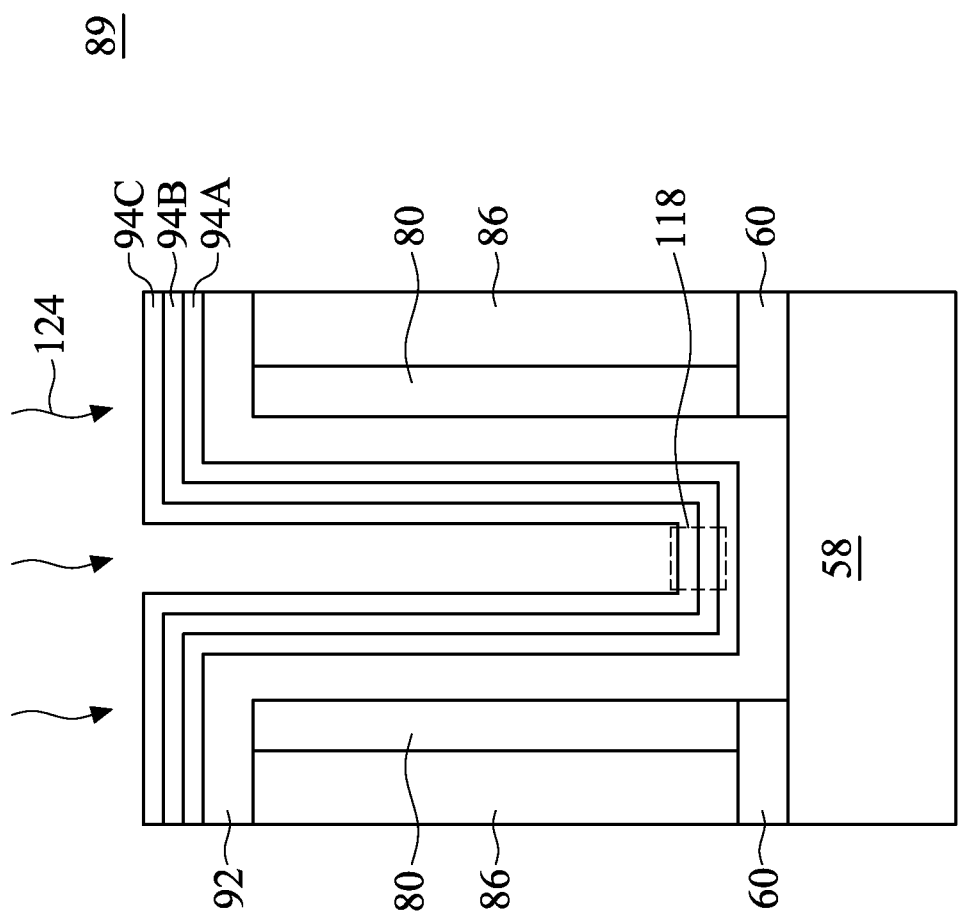
Figure 16B:
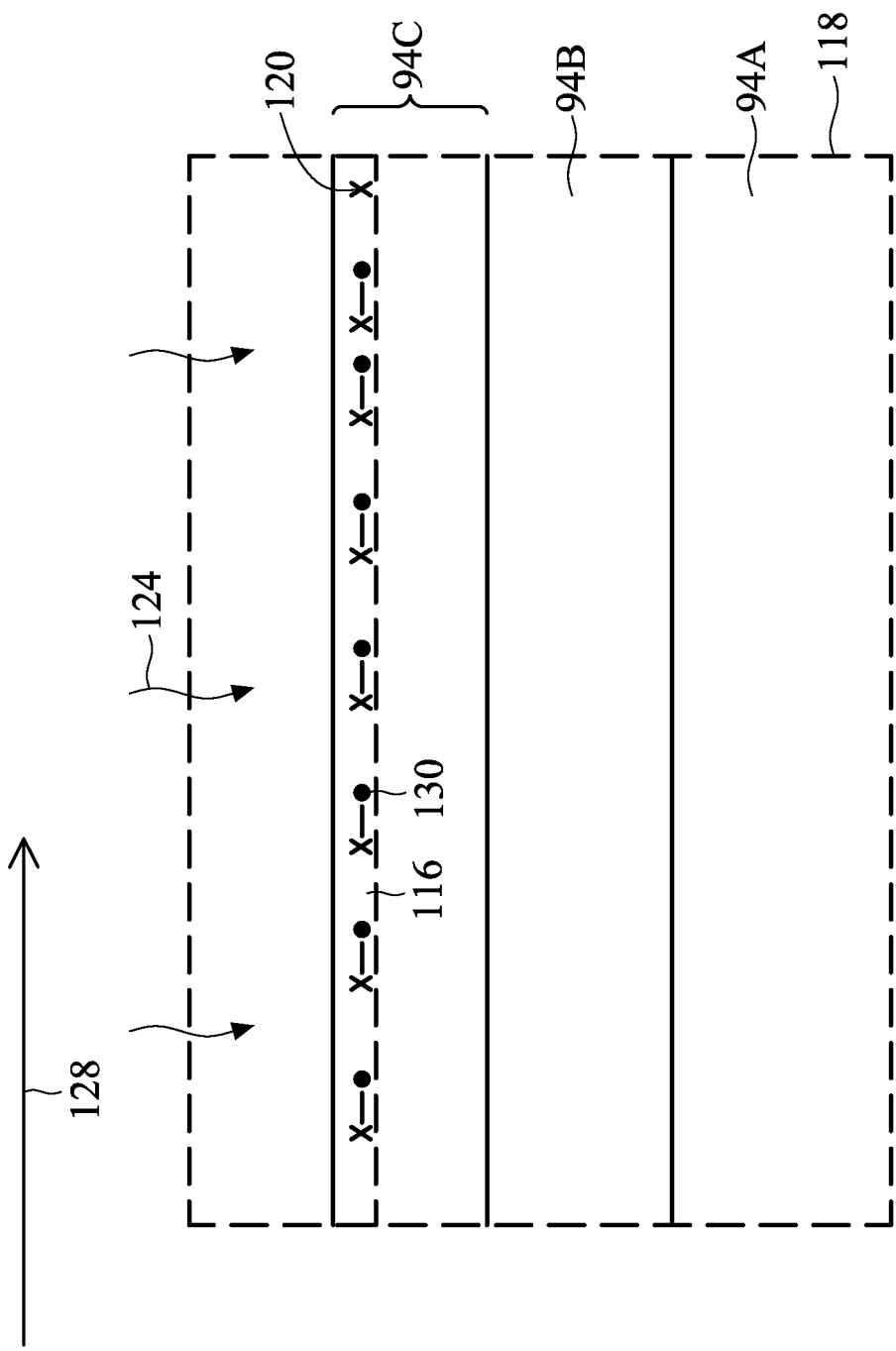

FIGS. 16A-16B illustrate a post-treatment process (represented in FIGS. 16A-16B by the curved arrows labeled 124) that is utilized to treat the anti-reaction layer 116 within the first work function tuning layer 94C, with FIG. 16B illustrating a close-up view of the dashed box labeled 118 in FIG. 16A. In particular, after the treatment process 114 has been performed, at least some of the active element dopants 120 may not be fully bonded to the material of the first work function tuning layer 94C, thereby leaving dangling bonds on one or more of the active element dopants 120. If these dangling bonds are not treated, subsequent processes could react in undesirable ways, thereby causing undesired defects.

As such, in some embodiments the anti-reaction layer 116 may be subsequently treated by the post-treatment process 124 to reduce or eliminate the number of dangling bonds and thereby reduce or eliminate defects caused by the dangling bonds. In some embodiments the post-treatment process 124 is used to add a second dopant (represented in FIG. 16B by the dots labeled 130) which will react and eliminate dangling bonds with the active element dopants 120. For example, in an embodiment in which the first work function tuning layer 94C is titanium nitride, and the active element dopant 120 is aluminum, the post-treatment process 124 may add a second dopant 130 such as nitrogen which will bond with the active element dopant 120 and reduce the number of dangling bonds.

In an embodiment the post-treatment process 124 may be a chemical soaking process which can be performed either in-situ along with the treatment process 114 or else performed ex-situ. In such an embodiment a post-treatment precursor (represented in FIG. 16B by the arrows labeled 128) is utilized to introduce the second dopant 130 into the first work function tuning layer 94C so that the second dopant 130 will bond with the dangling bonds of the active element dopant 120. In some embodiments, the second dopant 130 may be an element such as nitrogen, silicon, boron, halogen elements, combinations of these, or the like, may be utilized. However, any suitable material may be utilized.

In an embodiment in which the post-treatment process 124 is a chemical soaking process, the second dopant 130 may be introduced by passing the post-treatment precursor 128 over the surface of the anti-reaction layer 116. In an embodiment the post-treatment precursor 128 is a chemical which comprises the desired material and also allows for the controlled placement of the second dopant 130. As such, while the precise post-treatment precursor 128 is dependent at least in part on the desired second dopant 130, in some embodiments the post-treatment precursor 128 may be a chemical such as ammonia ($NH_3$), $SiH_4$, $NF_3$, combinations of these, or the like. However, any suitable post-treatment precursors may be utilized.

To initiate the post-treatment process 124 the post-treatment precursor 128 is introduced to a treatment chamber over the anti-reaction layer 116. In an embodiment the post-treatment precursor 128 may be introduced at a flow rate of between about 10 sccm and about 2000 sccm, such as about 500 sccm. Additionally, the post-treatment process 124 may be performed at a pressure of between about 0.5 torr and about 25 torr, such as about 5 torr and at a temperature of between about 200° C. and about 470° C., such as about 400° C. However, any suitable process parameters may be utilized.

Accordingly, the post-treatment process 124 will react with the dangling bonds from the active element dopants 120 so that these dangling bonds are not available for subsequent reactions. In an embodiment the post-treatment process 124 may be continued for a time sufficient to have a second dopant 130 concentration along a top surface of the anti-reaction layer 116 of between about 0.5% and about 20%, such as about 3%. For example, the post-treatment process 124 may be continued for a time of between about 0.5 seconds and about 180 seconds, such as greater than about 20 seconds. However, any suitable time may be utilized.

For example, in an embodiment in which the first work function tuning layer 94C comprises titanium nitride, the active element dopant 120 is aluminum, and the second dopant 130 is nitrogen, the first work function tuning layer 94C will comprise nitrogen from both the original deposition process (wherein a peak nitrogen concentration may occur away from the surface) as well as nitrogen from the post-treatment process 124 (wherein a peak nitrogen concentration will occur at the surface due to diffusion). As such, the first work function tuning layer 94C may have multiple peaks of concentration, such as two peaks of concentration for the nitrogen.

Figure 17:
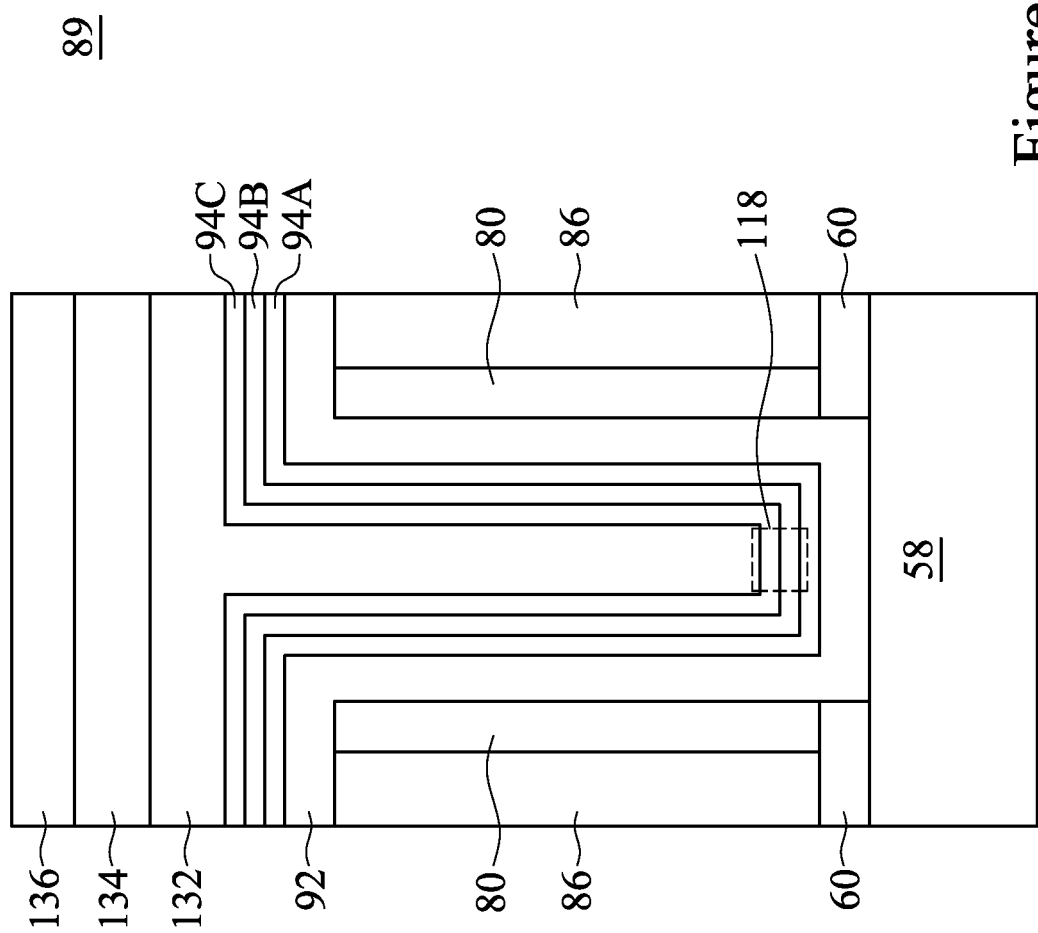

FIG. 17 illustrates that, once the post-treatment process 124 has been performed and the anti-reactive layer 116 has been finalized, a mask may be placed over the first work function tuning layer 94C in preparation for a patterning of the first work function tuning layer 94C. In an embodiment the mask is a tri-layer photoresist, with a bottom layer 132, a middle layer 134, and a photoresist 136. In an embodiment the bottom layer 132 may be a bottom anti-reflective coating (BARC) layer which has different optical properties than the photoresist 136 that works to prevent the uncontrolled and undesired reflection of energy (e.g., light) back into the overlying photoresist 136 during an exposure of the photoresist 136, thereby preventing the reflecting light from causing reactions in an undesired region of the photoresist 136. For example, the bottom layer 132 may have a different refractive index (n), a different extinction coefficient (k), or a different thickness (T) value than the photoresist 136. Additionally, the bottom layer 132 may be used to provide a planar surface, helping to reduce the negative effects of the energy impinging at an angle.

In an embodiment the bottom layer 132 comprises a polymer resin, a catalyst, and a cross-linking agent, all of which are placed into a BARC solvent for dispersal. The polymer resin may comprise a polymer with various monomers bonded together along with a chromophore group. The material for the bottom layer 132 may be applied to the first work function tuning layer 94C so that the material for the bottom layer 132 coats an upper exposed surface of the first work function tuning layer 94C, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the bottom layer 132 may be initially applied such that it has a thickness of between about 10 nm and about 1000 nm, such as about 100 nm.

However, because the bottom layer 132 may also comprise oxygen, as the bottom layer 132 is dispensed over and comes in contact with the first work function tuning layer 94C during subsequent processing, the oxygen within the bottom layer 132 may begin to diffuse into the first work function tuning layer 94C. However, with the presence of the active element dopants 120, any oxygen that diffuses into the first work function tuning layer 94C will enter the anti-reaction layer 116 first, where the oxygen will react with the active element dopants 120 and be captured before diffusing further into the first work function tuning layer 94C.

Further, by reacting with the active element dopants 120, the products of the active element dopants 120 and the oxygen will additionally serve to prevent the diffusion of additional oxygen from the bottom layer 132. As such, the overall diffusion of oxygen can be reduced, thereby reducing the oxidation of the underlying material of the first work function tuning layer 94C. Such a reduction in the amount of oxidation allows the first work function tuning layer 94C to be formed to a smaller thickness than would otherwise be possible without blocking the oxidation, and allows for a boost in the ability to fine tune and/or control the threshold voltage of devices made using these methods as devices extend into smaller and smaller processing nodes (e.g., the 5 nm process node, the 3 nm process, or even smaller).

By capturing any oxygen that has diffused into the first work function tuning layer 94C with the active element dopant 120, the amount of oxygen that penetrates into the first work function tuning layer 94C can be reduced and restricted to a top surface of the first work function tuning layer 94C. For example, in an embodiment the oxygen will diffuse no farther than between about 5 Å and about 30 Å, such as about 15 Å, into the first work function tuning layer 94C. Further, the concentration of oxygen at the surface of the first work function tuning layer 94C may be between about 10% and about 30%, such as about 20%.

The middle layer 134 may be placed over the bottom layer 132. In an embodiment the middle layer 134 may be an organic layer or inorganic layer that has a different etch resistance than the photoresist 136. In a particular embodiment the middle layer 134 is a hard mask material such as silicon, silicon nitride, oxides, oxynitrides, silicon carbide, combinations of these, or the like. The hard mask material for the middle layer 134 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combinations are fully intended to be included within the scope of the embodiments. The middle layer 134 may be formed to a thickness of between about 100 Å and about 800 Å, such as about 300 Å.

The photoresist 136 is placed over the middle layer 134 in order to provide a patterned mask so that the middle layer 134 can be patterned into the desired pattern. In an embodiment the photoresist 136 is a photosensitive material that is dispersed onto the middle layer 134 and then exposed to a patterned energy source (e.g., light) in order to induce a chemical reaction in those portions of the photosensitive material that are exposed. This chemical reaction causes a change in physical properties which may be utilized in a development process to separate the exposed portion of the photosensitive material from the unexposed portion of the photosensitive material to create a patterned photoresist.

Once the photoresist 136 has been patterned into the desired pattern, the photoresist 136 may be used as a mask to pattern the middle layer 134 and the bottom layer 132. Further, with the bottom layer 132 patterned, undesired portions of the first work function tuning layer 94C (portions which are not illustrated in FIG. 17) may be removed using, e.g., a suitable anisotropic etching process. However, any suitable removal process may be utilized.

Figure 18:
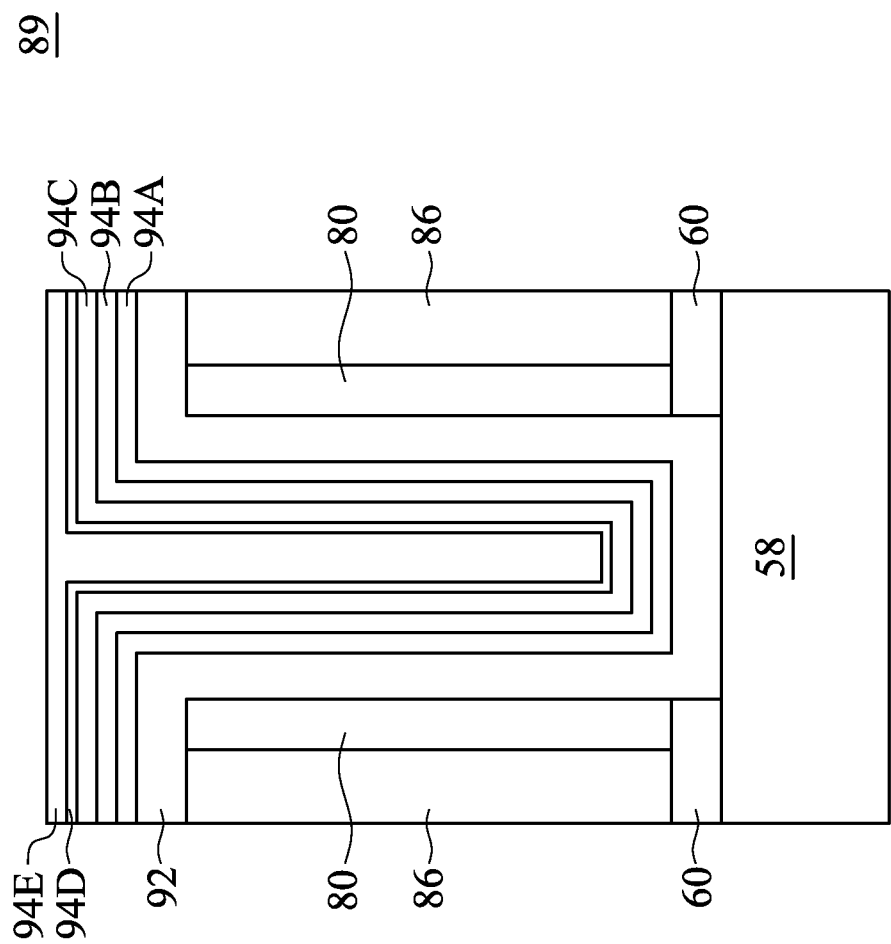

FIG. 18 illustrates that, once the first work function tuning layer 94C has been formed and patterned, a glue layer 94D may be formed in order to help adhere the overlying fill material 94E with the underlying first work function tuning layer 94C as well as provide a nucleation layer for the formation of the fill material 94E. In an embodiment the glue layer 94D may be a material such as titanium nitride and may be formed using a similar process such as ALD to a seventh thickness of between about 10 Å and about 100 Å, such as about 50 Å. However, any suitable materials and processes may be utilized.

Once the glue layer 94D has been formed, the fill material 94E is deposited to fill a remainder of the opening. In an embodiment the fill material 94E may be a material such as tungsten, Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. Additionally, the fill material 94E may be deposited to a thickness of between about 1000 Å and about 2000 Å, such as about 1500 Å. However, any suitable material may be utilized.

Figure 19B:
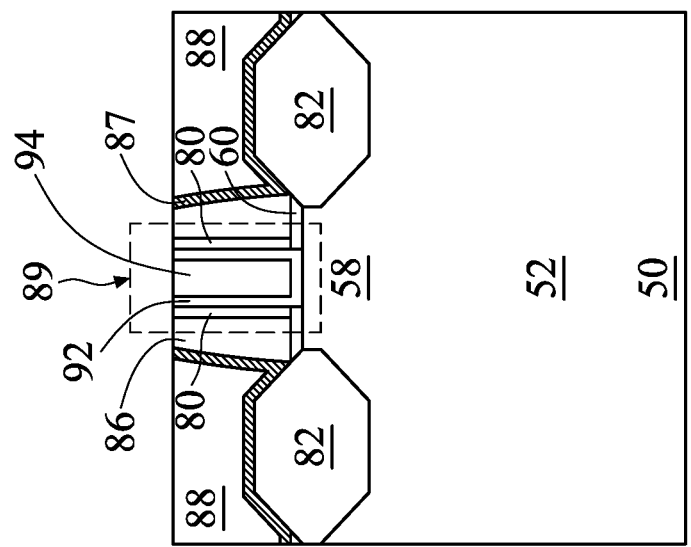
Figure 19A:
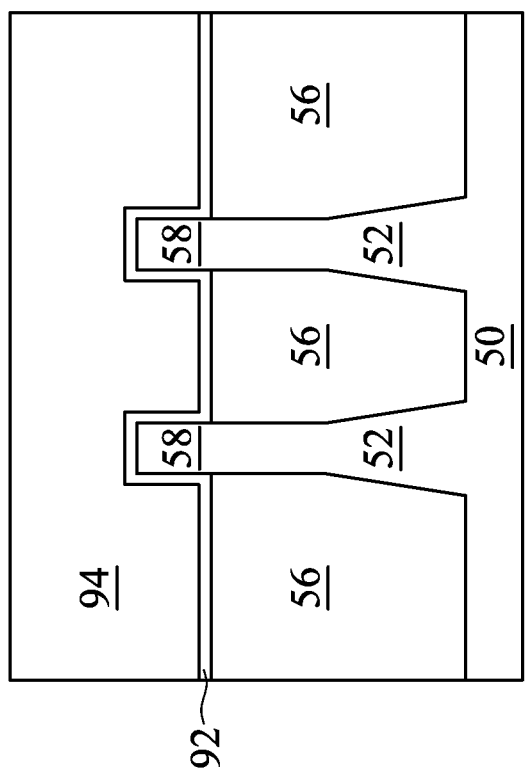

FIGS. 19A-19B illustrate that, after the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes. However, the treatment process 114 and any other desired processes described herein may be applied to any of the work function layers that are desired to be manufactured.

In FIGS. 20A and 20B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 20A and 20B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 16A and 16B) penetrate through the second ILD 108 and the gate mask 96 to contact the top surface of the recessed gate electrode 94.

In FIGS. 21A and 21B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

By using the anti-reaction layer 116 to help reduce or eliminate the amount of oxygen that diffuses into the first work function tuning layer 94C, there are fewer oxygen-related defects that can occur in the lower portions of the first work function tuning layer 94C. As such, by limiting the oxygen to a smaller region, a larger region of the first work function tuning layer 94C can be obtained with a similar thickness. Accordingly, the overall thickness of the first work function tuning layer 94C can be reduced, helping to reduce the overall structure.

Figure 22A:
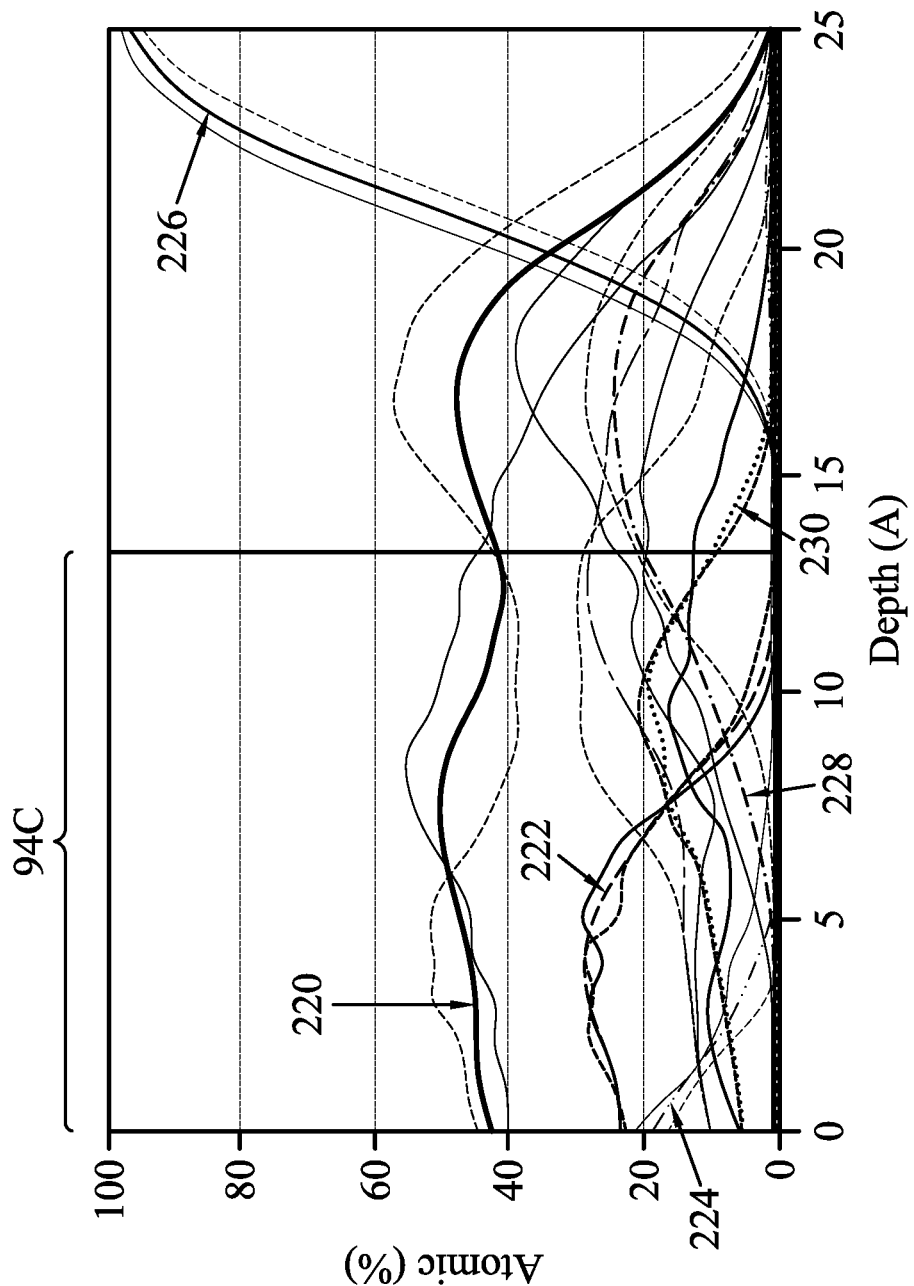
FIGS. 22A, 22B, 23A, and 23B illustrate charts of the compositions of layers with active element dopants present.
Figure 22B:
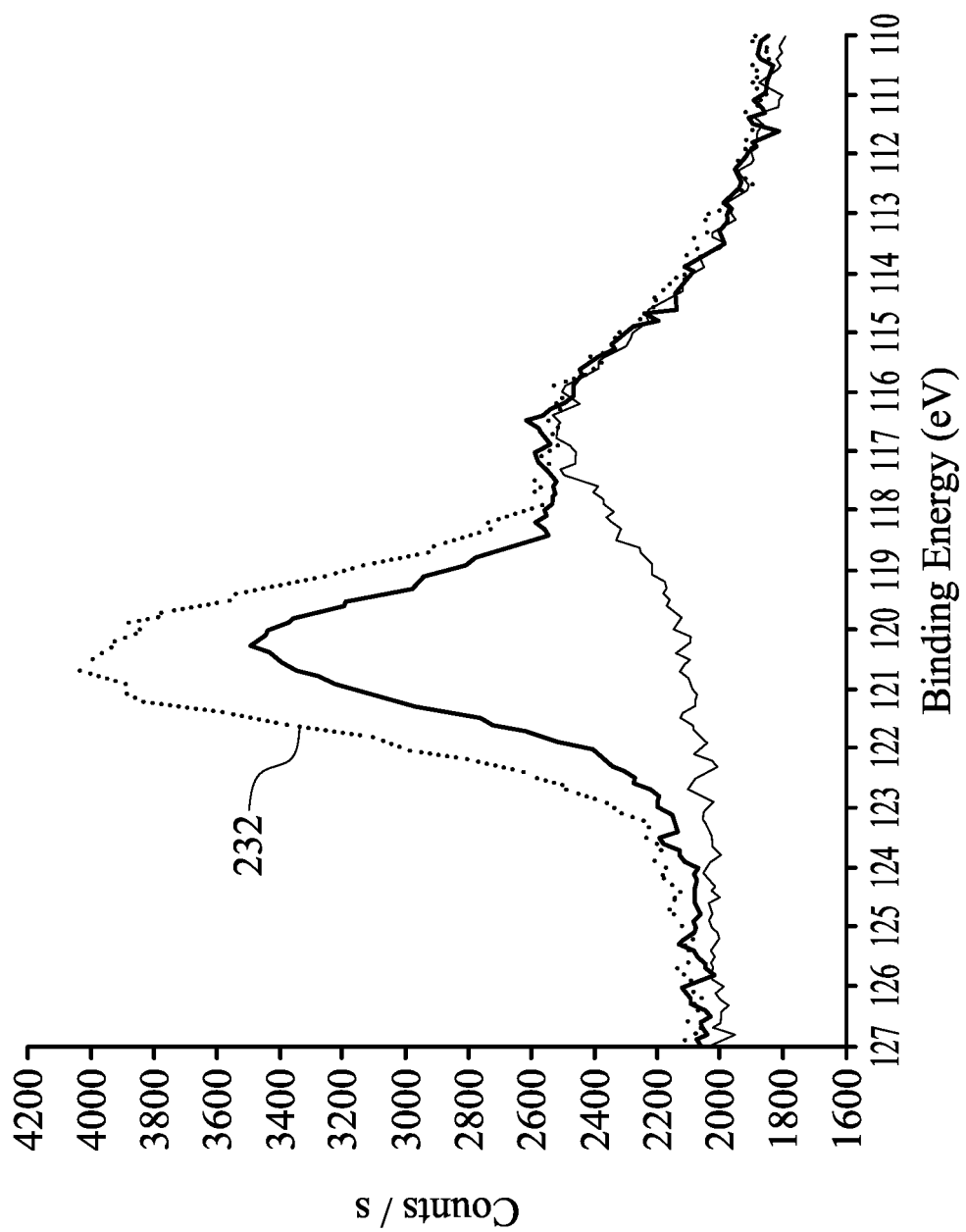

FIGS. 22A and 22B illustrate test results of one embodiment of the first work function tuning layer 94C in which a material such as tungsten carbon nitride is utilized for the first work function tuning layer 94C. In this embodiment, the active element dopant 120 is aluminum, which is represented in FIG. 22A by the line labeled 222. Additionally in FIG. 22A, the line labeled 220 illustrates the atomic percentage of oxygen, the line labeled 224 illustrates the atomic percentage of carbon, the line labeled 226 illustrates the atomic percentage of silicon, the line labeled 228 illustrates the atomic percentage of silicon oxide, and the line labeled 230 illustrates the atomic percentage of nitrogen. As can be seen, the amount of the active element dopant 120 (e.g., aluminum) has a concentration gradient as the measurement extends away from the surface and towards the underlying layers. Further, it can be seen that, by using the active element dopant 120 as described herein, the atomic percentage of oxygen can be reduced from about 60% (in a process which does not utilize the active element dopant 120) to be between about 42% and about 50%.

FIG. 22B illustrates that the active element dopant 120 (e.g., aluminum) that is present within the first work function tuning layer 94C is bonded as described. In particular, the line labeled 232 in FIG. 22B provides the indication that the aluminum within the first work function tuning layer 94C is bonded to oxygen. As such, the aluminum reacts with and binds the oxygen that is diffusing into the first work function tuning layer 94C.

Figure 23A:
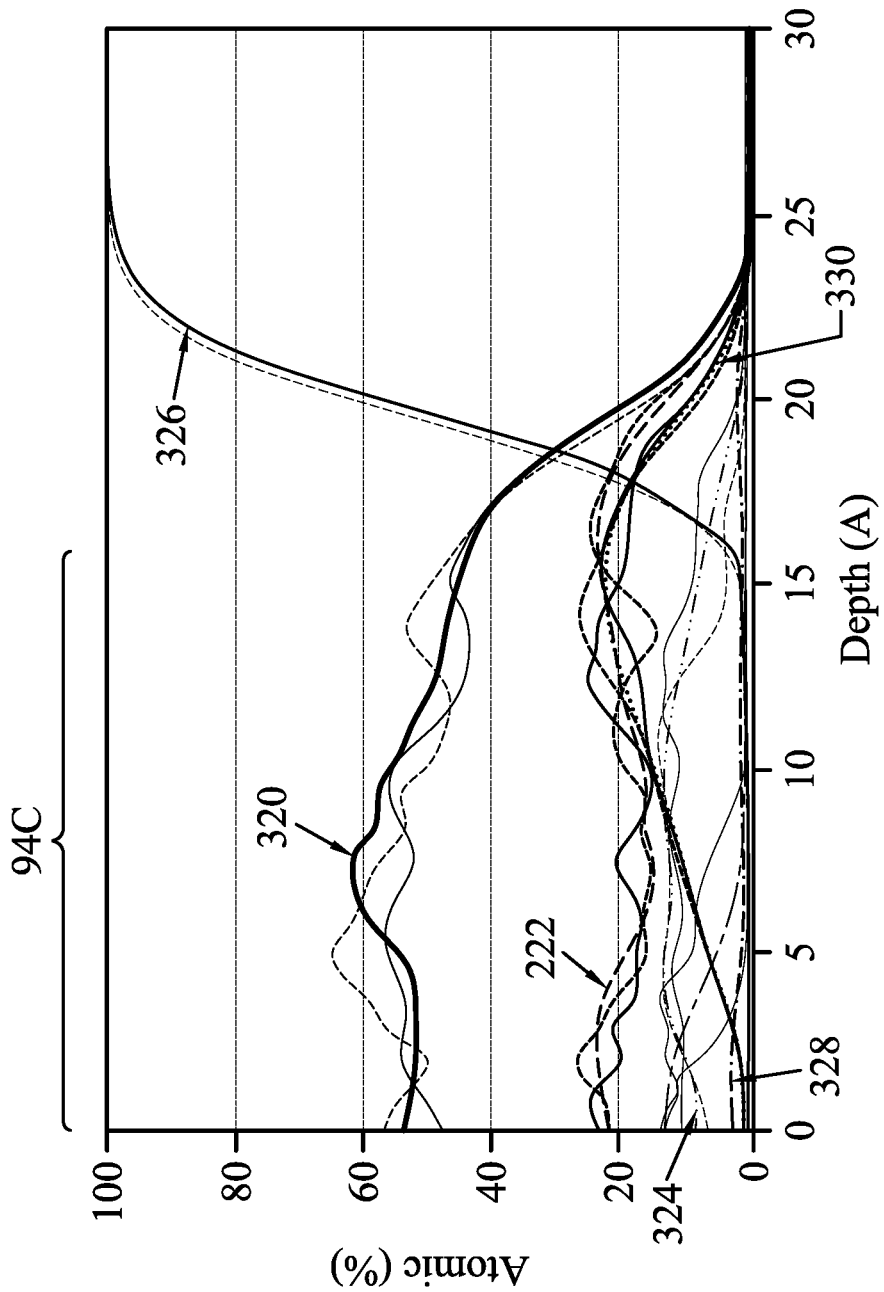
Figure 23B:
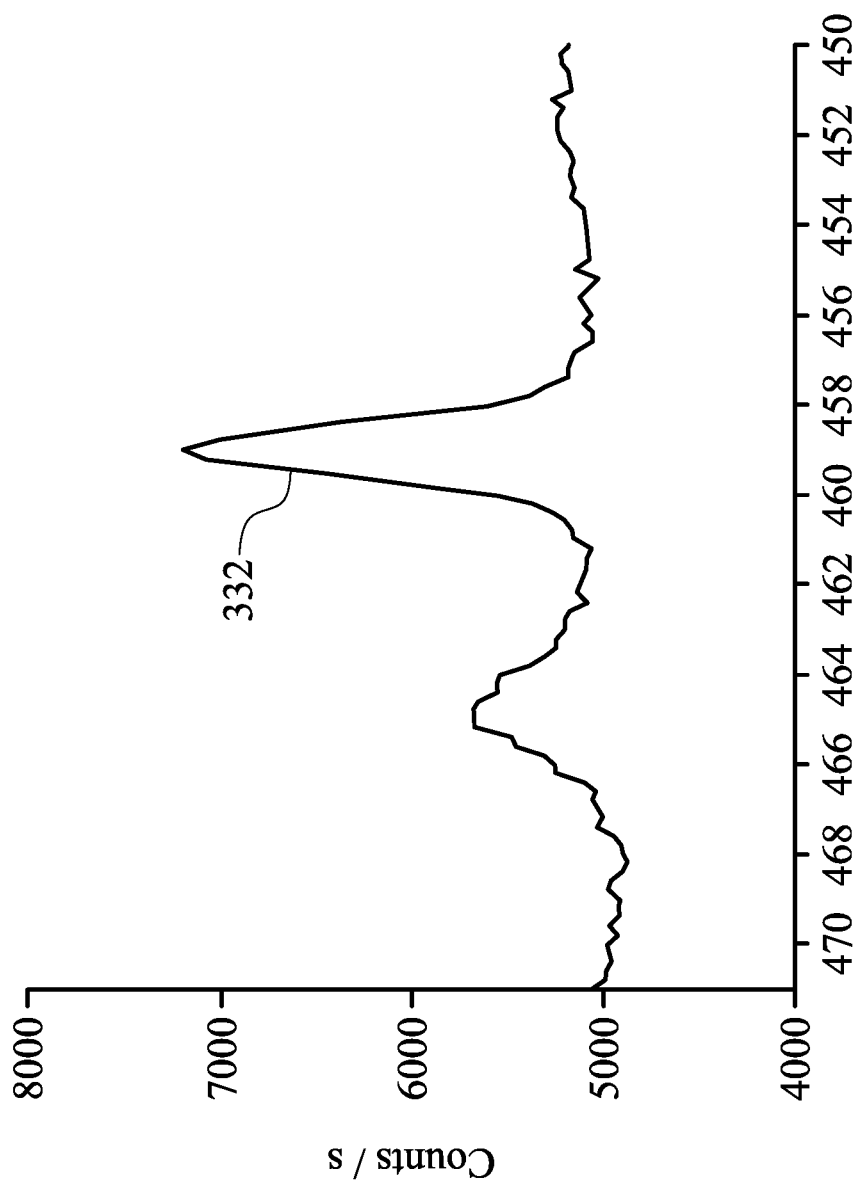

FIGS. 23A and 23B illustrate test results of one embodiment of the first work function tuning layer 94C in which a material such as tungsten carbon nitride is utilized for the first work function tuning layer 94C. In this embodiment, the active element dopant 120 is titanium, which is represented in FIG. 23A by the line labeled 328. Additionally in FIG. 23A, the line labeled 320 illustrates the atomic percentage of oxygen, the line labeled 324 illustrates the atomic percentage of nitrogen, the line labeled 326 illustrates the atomic percentage of silicon, the line labeled 328 illustrates the atomic percentage of oxygen, and the line labeled 330 illustrates the atomic percentage of silicon oxide. As can be seen, the amount of the active element dopant 120 (e.g., titanium) has a concentration gradient as the measurement extends away from the surface and towards the underlying layers. Further, it can be seen that, by using the active element dopant 120 as described herein, while being not quite as much reduction as illustrated in FIGS. 22A-22B, the atomic percentage of oxygen can still be reduced from about 60% (in a process which does not utilize the active element dopant 120) to be less than 60% at most points within the first work function tuning layer 94C.

FIG. 23B illustrates that the active element dopant 120 (e.g., titanium) that is present within the first work function tuning layer 94C is bonded as described. In particular, the line labeled 332 in FIG. 22B provides the indication that the titanium within the first work function tuning layer 94C is bonded to oxygen. As such, the titanium reacts with and binds the oxygen that is diffusing into the first work function tuning layer 94C.

Figure 24:
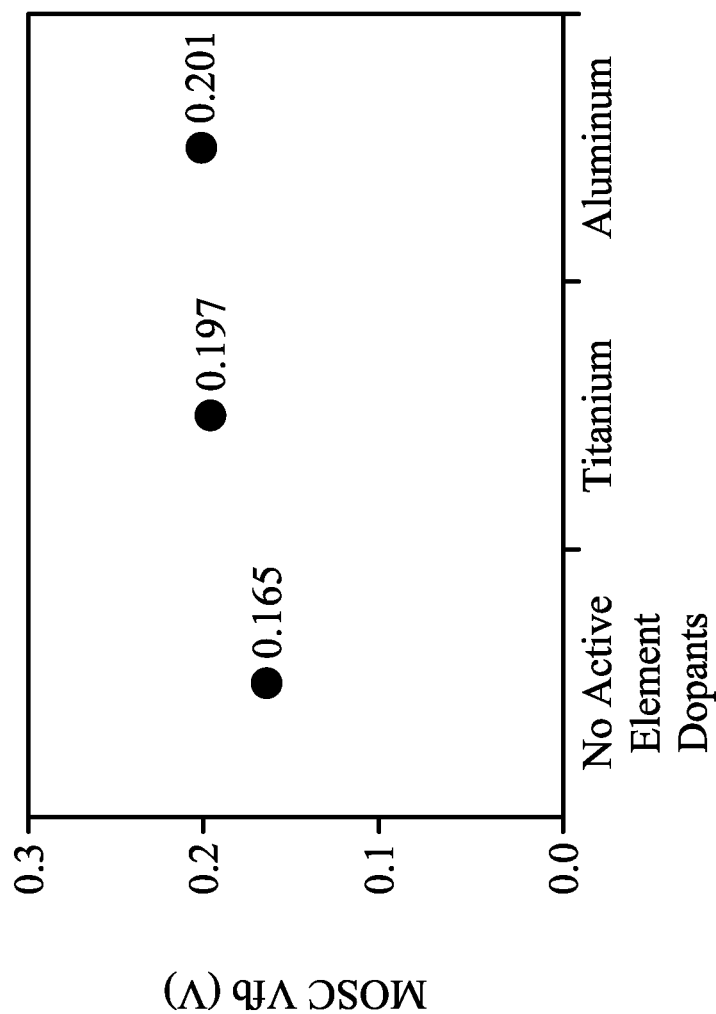
FIG. 24 illustrates a chart of flat band voltages with respect to different active element dopants.

FIG. 24 illustrates another benefit of introducing the active element dopants 120 into the first work function tuning layer 94C. As can be seen, when an active element dopant 120 such as titanium is introduced, the flat band voltage (Vfb) of the device formed with the active element dopants 120 is increased from a device without the active element dopants 120 being located within the first work function tuning layer 94C (e.g., from 0.165 V to 0.197 V). Further, if the active element dopant 120 is aluminum, the flat band voltage can be increased even further (e.g., from 0.165 V to 0.201 V).

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

In an embodiment, a method of manufacturing a semiconductor device includes: forming a fin from a semiconductor substrate; forming a gate dielectric over the fin; forming a work function layer over the gate dielectric; and modifying a surface of the work function layer, wherein the modifying the surface is performed at least in part with a chemical soak that implants an active element. In an embodiment the active element is aluminum. In an embodiment the chemical soak comprises introducing tungsten fluoride to the work function layer. In an embodiment the forming the work function layer is performed at least in part with an atomic layer deposition process to a thickness of between about 10 Å and about 30 Å. In an embodiment the method further includes reacting the active element with oxygen.

In another embodiment, a method of manufacturing a semiconductor device includes: depositing a gate dielectric over a channel region of a semiconductor material, the channel region being adjacent to multiple sides of the semiconductor material; depositing a work function layer over the gate dielectric using an atomic layer deposition process; soaking the work function layer in a precursor material, wherein the soaking the work function layer forms a dopant layer within the work function layer; and depositing a fill material over the work function layer. In an embodiment the precursor material is titanium chloride. In an embodiment the depositing the work function layer deposits the work function layer to a thickness of between about 10 Å and about 30 Å. In an embodiment the soaking the work function layer is performed in-situ with the depositing the work function layer. In an embodiment the depositing the work function layer deposits titanium nitride. In an embodiment the method further includes performing a post-treatment process after the soaking the work function layer in the precursor material, the post-treatment process reducing a number of dangling bonds within the work function layer. In an embodiment the post-treatment process adds nitrogen to the work function layer. In an embodiment the post-treatment process flows ammonia over the work function layer. In an embodiment the dopant layer comprises titanium.

In yet another embodiment, a semiconductor device including: a semiconductor fin; a dielectric material adjacent to the semiconductor fin; a work function layer over the dielectric material, the work function layer comprising a dopant layer; and a fill material over the work function layer. In an embodiment the dopant layer comprises titanium. In an embodiment the dopant layer comprises boron. In an embodiment the dopant layer comprises chromium. In an embodiment the work function layer has a thickness no greater than 30 Å. In an embodiment the dopant layer has a thickness of between about 1 Å and about 10 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a fin over a semiconductor substrate;
a gate dielectric over the fin;
a work function layer over the gate dielectric; and
an active element diffusion region within the work function layer, the active element diffusion region comprising an oxygen blocking dopant, wherein the oxygen blocking dopant comprises chromium.

2. The semiconductor device of claim 1, wherein the active element diffusion region comprises a second oxygen blocking dopant, wherein the second oxygen blocking dopant comprises aluminum.

3. The semiconductor device of claim 2, wherein the aluminum is bonded to nitrogen.

4. The semiconductor device of claim 1, wherein the work function layer has a thickness of between about 10 Å and about 30 Å.

5. The semiconductor device of claim 1, wherein a concentration of the oxygen blocking dopant along a top surface of the active element diffusion region is between about 1% and about 5%.

6. A semiconductor device comprising:
a gate dielectric over a channel region of a semiconductor material, the channel region being adjacent to multiple sides of the semiconductor material;
a work function layer over the gate dielectric;
an oxygen-blocking dopant layer within the work function layer, the oxygen-blocking dopant layer comprising one or more oxygen-blocking dopants, wherein the one or more oxygen-blocking dopants comprises boron; and
a fill material over the work function layer.

7. The semiconductor device of claim 6, wherein the work function layer has a thickness of between about 10 Å and about 30 Å.

8. The semiconductor device of claim 6, wherein the work function layer is titanium nitride.

9. The semiconductor device of claim 6, wherein the oxygen-blocking dopant layer comprises nitrogen.

10. The semiconductor device of claim 9, wherein the oxygen-blocking dopant layer comprises aluminum.

11. The semiconductor device of claim 10, wherein the nitrogen concentration along a top surface of the oxygen-blocking dopant layer is between about 0.5% and about 3%.

12. The semiconductor device of claim 6, wherein the work function layer comprises oxygen extending into the work function layer, the oxygen extending no farther than between about 5 Å and about 30 Å.

13. The semiconductor device of claim 6, wherein the oxygen-blocking dopant layer has a thickness of between about 1 Å and about 5 Å.

14. The semiconductor device of claim 13, wherein the oxygen-blocking dopant layer comprises titanium.

15. A semiconductor device comprising:
a semiconductor fin;
a dielectric material adjacent to the semiconductor fin;
a work function layer over the dielectric material, the work function layer comprising a dopant layer, the dopant layer comprises one or more oxygen-blocking dopants, wherein the one or more oxygen-blocking dopants comprises titanium; and
a fill material over the work function layer.

16. The semiconductor device of claim 15, wherein the one or more oxygen-blocking dopants comprises boron.

17. The semiconductor device of claim 15, wherein the one or more oxygen-blocking dopants comprises chromium.

18. The semiconductor device of claim 15, wherein the work function layer has a thickness no greater than 30 Å.

19. The semiconductor device of claim 15, wherein the dopant layer has a thickness of between about 1 Å and about 10 Å.

20. The semiconductor device of claim 15, wherein the work function layer comprises titanium nitride.

* * * * *